(12) United States Patent
Miyazaki et al.

(10) Patent No.: US 7,305,275 B2
(45) Date of Patent: Dec. 4, 2007

(54) MATERIAL SUPPLY SYSTEM IN SEMICONDUCTOR DEVICE MANUFACTURING PLANT

(75) Inventors: Kunihiro Miyazaki, Ibaraki (JP); Soichi Nadahara, Kanagawa (JP); Kinya Usuda, Kanagawa (JP); Masaji Akahori, Kanagawa (JP); Sota Nakagawa, Kanagawa (JP); Ken Nakajima, Kanagawa (JP)

(73) Assignee: Ebara Corporation, Tokyo (JP)

( * ) Notice: Subject to any disclaimer, the term of this patent is extended or adjusted under 35 U.S.C. 154(b) by 225 days.

(21) Appl. No.: 10/507,699

(22) PCT Filed: Mar. 27, 2003

(86) PCT No.: PCT/JP03/03874

§ 371 (c)(1),
(2), (4) Date: Apr. 11, 2005

(87) PCT Pub. No.: WO03/081647

PCT Pub. Date: Oct. 2, 2003

(65) Prior Publication Data

US 2005/0177273 A1    Aug. 11, 2005

(30) Foreign Application Priority Data

Mar. 27, 2002    (JP)    ............... 2002-088153

(51) Int. Cl.
G06F 19/00    (2006.01)
(52) U.S. Cl. ........................ 700/99; 210/900
(58) Field of Classification Search ................ 700/99, 700/231; 210/900; 118/715
See application file for complete search history.

(56) References Cited

U.S. PATENT DOCUMENTS

| 4,852,001 A | * | 7/1989 | Tsushima et al. ............... 705/8 |
| 5,023,787 A | * | 6/1991 | Evelyn-Veere .............. 700/284 |
| 5,656,557 A | * | 8/1997 | Hata et al. .................. 423/219 |
| 6,461,519 B1 | * | 10/2002 | Weltzer ...................... 210/739 |
| 2001/0009138 A1 | * | 7/2001 | Botelho et al. ............. 118/715 |

(Continued)

FOREIGN PATENT DOCUMENTS

JP    63-062325    *    3/1988

(Continued)

*Primary Examiner*—Leo Picard
*Assistant Examiner*—Steven R. Garland
(74) *Attorney, Agent, or Firm*—Oblon, Spivak, McClelland, Maier & Neustadt, P.C.

(57) ABSTRACT

In a small scaled plant intended for flexible manufacturing, a pure water supply system is provided at a low cost without reducing a production efficiency. A pure water system produces a plurality of grades of pure water which are supplied through pipes connected to points of use for cleaning, CMP, lithography, and the like. Upon receipt of a request signal from each point of use for starting to use a certain grade of pure water, a controller determines whether or not a required amount exceeds the capacity of the grade of pure water which can be supplied by the pure water system. If not, the controller sends a use permission signal to the point of use for permitting the same to use the pure water. When a certain use point is using the requested grade of pure water, the controller may not permit the requesting point of use to use the pure water until a use end signal is sent from the use point which is using the pure water.

16 Claims, 14 Drawing Sheets

U.S. PATENT DOCUMENTS

2001/0051886 A1* 12/2001 Mitsutake et al. ............. 705/7
2003/0221960 A1* 12/2003 Nakao et al. .......... 204/298.09
2004/0078092 A1* 4/2004 Addink et al. ................. 700/1

FOREIGN PATENT DOCUMENTS

| JP | 09-047750 | 2/1997 |
| JP | 2000-135426 | * 5/2000 |
| JP | 2000135426 | 5/2000 |
| WO | 96/29598 | 9/1996 |

* cited by examiner

Fig. 4

| POINT OF USE | GRADE | RESISTIVITY (MΩ·cm) | Metal (ppb) | SiO2 (ppb) | TOC (ppb) | DO (ppb) | BACTERIA (COUNTS/LITER) | PARTICULATES (COUNTS/mLITER) | TEMPERATURE (°C) |
|---|---|---|---|---|---|---|---|---|---|
| LARGE CLEANING EQUIPMENT | ULTRAPURE WATER (FINAL RINSE WATER) | ≧18.0 | <0.5 | <0.5 | <2 | <5 | <1 | <1 (0.05 μ) | 23±1 |
| LARGE CLEANING EQUIPMENT / SMALL CLEANING EQUIPMENT / LITHOGRAHY EQUIPMENT | PRIMARY PURE WATER | ≧17.0 | — | <15 | <15 | <15 | <10 | <10 (0.1 μm) | 23±1 |
| CMP | | ≧13.0 | — | — | — | — | — | <10 (0.1 μm) | 23±1 |

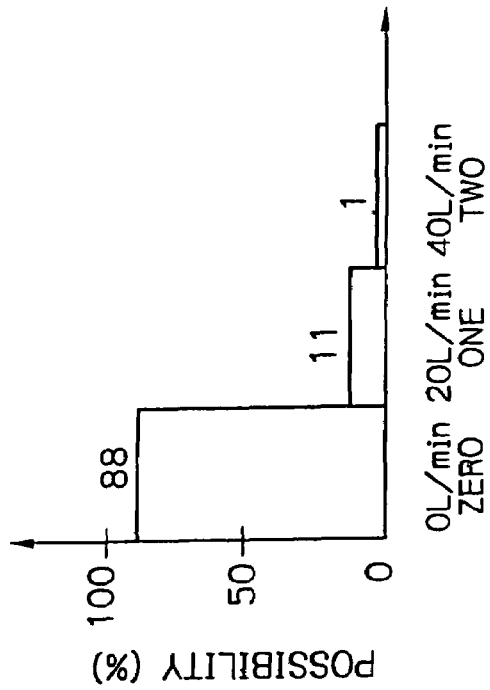
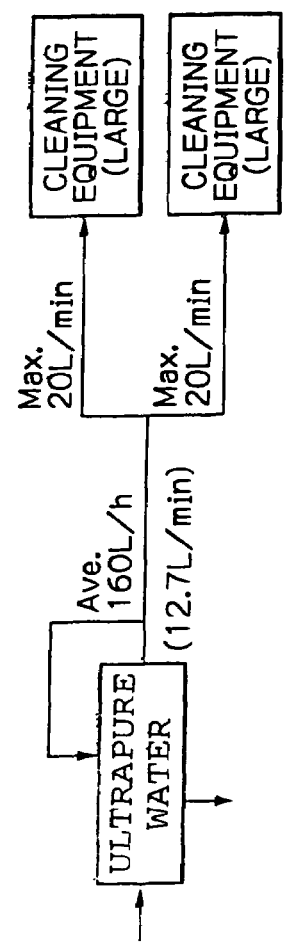
Fig. 5A
Fig. 5B

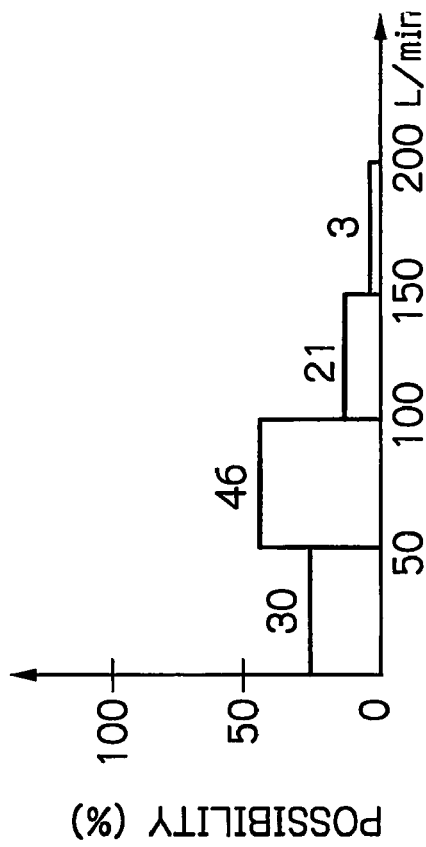
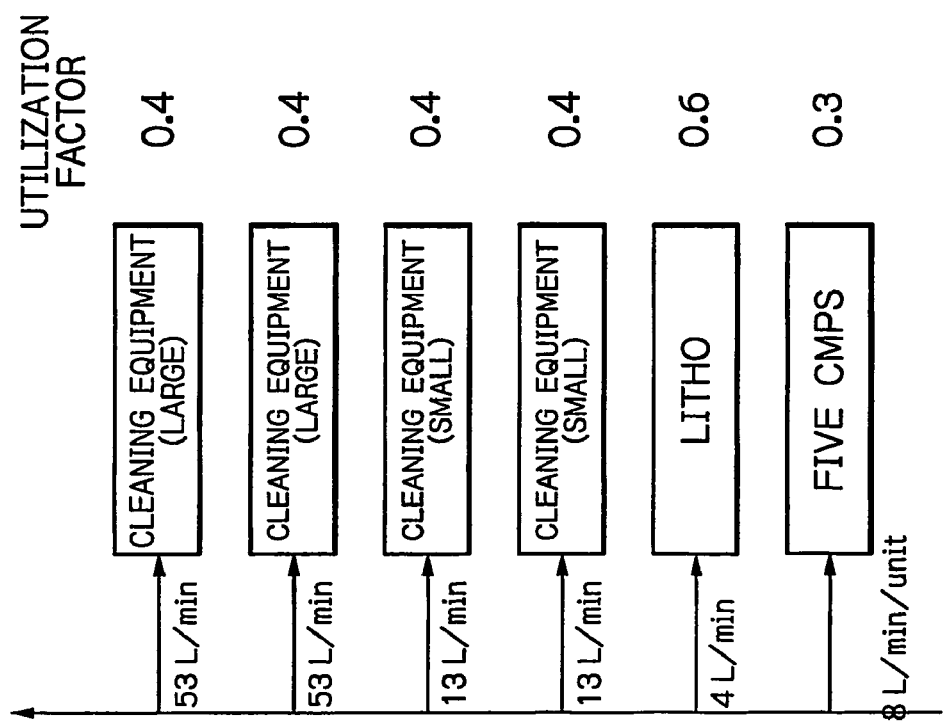
Fig. 6A
Fig. 6B

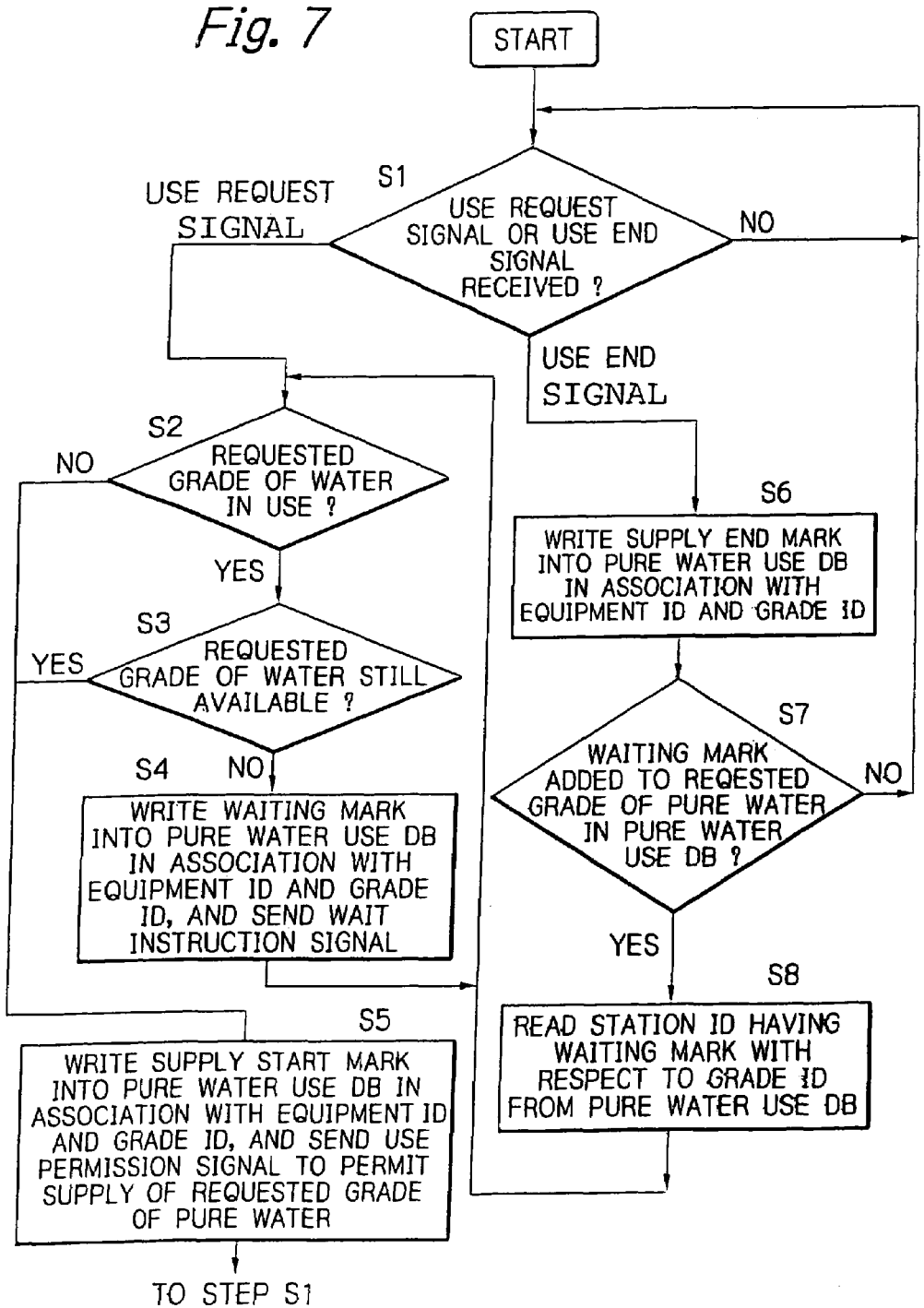

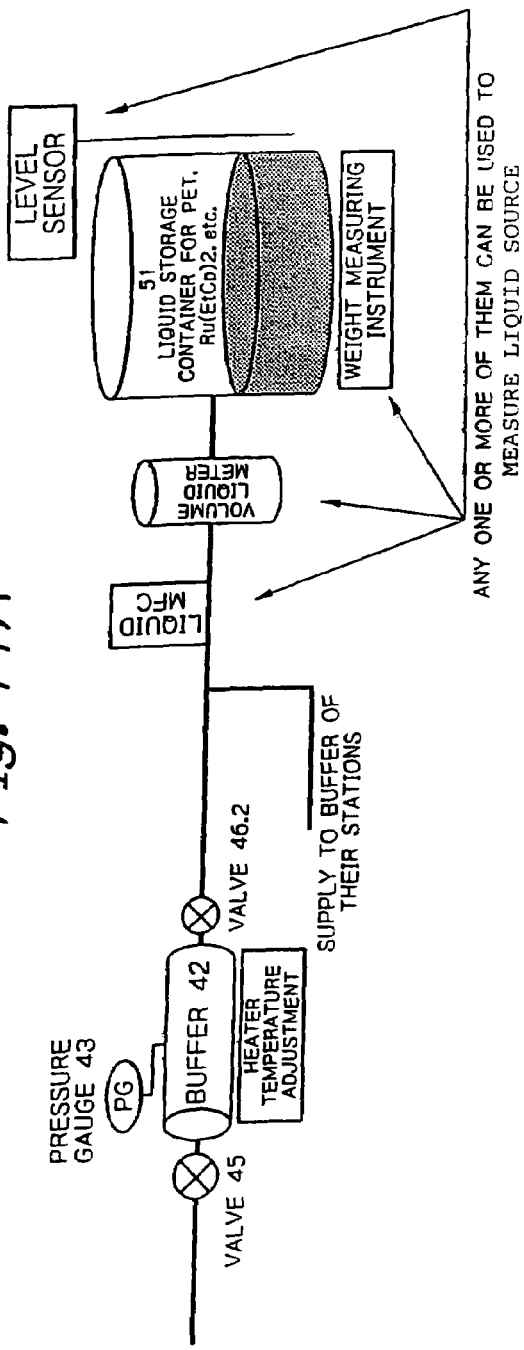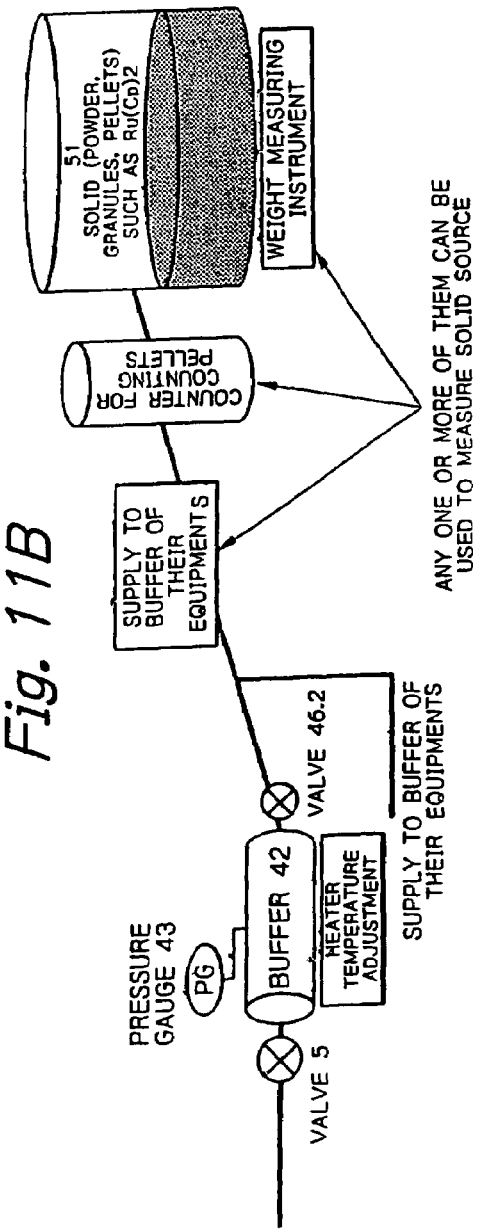
Fig. 11A
Fig. 11B

MATERIAL SUPPLY SYSTEM IN SEMICONDUCTOR DEVICE MANUFACTURING PLANT

TECHNICAL FIELD OF THE INVENTION

The present invention relates to semiconductor device manufacturing technologies, and more particularly to a material supply system for supplying processing facilities in a semiconductor device manufacturing plant with materials which include gases, liquids and solids. It should be first noted that the term "materials" used in this specification include gases and liquids for use in processing facilities for processing semiconductor wafers and cleaning the processing facilities themselves such as material gases and chemical, as well as gases, liquids and granular solids which are not directly used for reactions such as cooling water for pumps associated with the processing facilities, heaters for heating reaction chambers, and the like.

BACKGROUND ART

Conventional semiconductor device manufacturing plants are generally large in scale for relying on the mass production to reduce production costs. For example, one known manufacturing plant is capable of producing 1,000 lots (one lot includes 100 wafers) per month. In such a large scale plant, there are installed more than several hundred main apparatuses (equipments), and it would typically include more than one hundred points of use which are processing facilities that use pure water for processing.

FIG. 1 illustrates a pure water supply system which is an example of conventional material supply system. A pretreatment equipment 1 introduces a coagulants and the like into raw water, filters the raw water to remove turbid components included in the raw water, and stores the filtered water in a filtered water tank 2. Next, a primary pure water system 3 mainly removes ion components included in the filtered water from the pretreatment equipment 1 (and recovered water from a recovery system 7) to produce primary pure water which is stored in pure water tank 4. Next, an ultrapure water system (i.e., a subsystem) 5 further refines the primary pure water from the primary pure water system 3 to produce ultrapure water. The ultrapure water is supplied to a variety of points of use 6 in a semiconductor device manufacturing plant. Dilute waste water such as rinse water from the points of use 6 is recovered by the recovery system 7, and partially stored in the filtered water tank 2, depending on the condition of the recovered water, for reuse in the primary pure water production in the primary pure water system 3, and partially stored in a reuse tank 8 for reuse in the facilities of the plant as appropriate. Waste water other than the dilute waste water exhausted from the points of use 6 is processed in a waste water processing system 9 before it is emitted. In this event, solid components in the waste water are dehydrated and wasted as sludge.

The ultrapure water produced in the foregoing manner is supplied to all the points of use 6.

In the following description, the "primary pure water" and "ultrapure water" are represented by "pure water" when they are collectively referred to.

In recent years, however, semiconductor products have been increasingly required in a wider number of applications, including products for personal computers to digital electric appliances such as portable telephones, but they tend to have shorter life cycles. To meet this trend, a shift has been made from mass production to flexible production in the production of semiconductor products, and moreover, the production is required to be agile. A production method proposed to meet the requirements is a small-scaled semiconductor device manufacturing plant (hereinafter called the "small-scaled plant"). The small-scaled plant, however, is required to be as cost-competitive as a large-scaled semiconductor device manufacturing plant (hereinafter called the "large-scaled plant"), in addition to the requirement that it be capable of flexible production.

In regard to a pure water supply system in the small-scaled plant, a simple reduction in scale of the pure water supply system generally installed in a large-scaled plant would cause an increase in the production cost of pure water per unit (initial cost and running cost) which is reflected to a production cost of semiconductor products.

Such problems implied in the small-scaled plant are not limited to the supply of pure water, but may apply to the supply of materials such as material gases and chemicals for use in processing of semiconductor wafers, gases and liquids for washing processing facilities, cooling water for pumps associated with the processing facilities and heaters for heating reaction chambers, and the like.

On the other hand, in conventional semiconductor device manufacturing processes, a variety of processing facilities in the plant use numerous material gases, chemicals and solvents as required by particular processes. These materials are generally supplied from cylinder cabinets, gas generators, storage tanks for storing chemicals and solvents, and refiners such as ion exchangers through gas pipes or chemicals pipes routed over the plant, respectively. The supply facilities such as the cylinder cabinets, gas generators, storage tanks for storing chemicals and solvents, refiners such as ion exchangers, and the like must be sufficient in scale to appropriately support the plant in terms of consumption rates of the gases, chemicals and the like used therein. This requirement must be applied not only to the supply capabilities of the supply facilities but also to inner diameters of pipes, through which the materials are transported to respective manufacturing apparatuses associated therewith, in conformity to the consumption rates.

However, in the processing facilities, these material gases, chemicals and the like are not always consumed at the same rate. For example, in an LPCVD furnace in which a polycrystalline silicon film is deposited on a plurality of substrates in batches by LPCVD, the LPCVD furnace is supplied with a monosilane gas, which is the material of the silicon film, only when the silicon film is being deposited. Thus, although no monosilane gas is consumed when the furnace is evacuated, when semiconductor wafers are carried on shelf-like boards for processing, and the like, the supply capability of an associated supply facility, and the transport capability of associated piping are designed based on the flow rate of the monosilane gas when it is being consumed. When ten such LPCVD equipments are installed in a plant, the supply facilities and transport facilities are provided for the ten equipments. Not limited to those materials which are consumed directly in relation to the processing of semiconductor wafers, such as the monosilane gas, cooling water for a heater is required only when the heater is operated for heating, and less water is required when the heater is not operated.

Furthermore, the diameter of semiconductor wafers used in the semiconductor manufacturing processes tends to become larger year by year from a view point of production efficiency, and accordingly larger processing chambers are provided in the semiconductor manufacturing plant, causing an increase in the amounts of material gases and chemicals consumed therein. Eventually, large capacities are required to such supply facilities and transport facilities in order to supply required amounts of material gases, chemicals and the like, resulting in an increased investment on the facilities.

Thus, a serious problem exists not only in small-scaled plant but in large-scaled plant, namely, how to economically run a system for supplying material gases, chemicals and the like through a reduction in capacity.

DISCLOSURE OF THE INVENTION

The present invention has been made in view of the above-mentioned problems found in the prior art, and it is an object of the invention to provide a material supply system in a semiconductor device manufacturing plant which not only entails a low initial cost and running cost, but is also capable of efficiently supplying processing facilities with just the required amounts of materials only when they are required for processing semiconductor wafers.

To achieve the above object, in a first aspect, the present invention provides a material supply system for supplying the same kind of a gas, liquid or solid material to a plurality of processing facilities in a semiconductor device manufacturing plant, the system comprising:

a material supply source; and a controller for controlling the supply of the material from a supply source to the processing facilities, such that a total amount of the material currently used by the plurality of processing facilities does not exceed an amount of the material which can be supplied from the supply source, by controlling a start timing from which the material is supplied to a processing facility.

In the material supply system in the first aspect according to the present invention, it is preferable that at least two of the plurality of processing facilities are adapted to send to the controller use request signals for requesting to start using the material, or the use request signal and use end signals for notifying the end or an end notice of use of the material, and the controller is adapted to determine, upon receipt of the use request signal associated with the material currently used in at least one processing facility from another processing facility, whether or not a total amount of the material required by these processing facilities exceeds the amount of the material which can be supplied by the supply source, and send a use permission signal to the other processing facility to permit the other processing facility to use the material when determining that the total amount does not exceed.

In a second aspect, the present invention also provides a material supply system for supplying the same kind of a gas, liquid or solid material to a plurality of processing facilities in a semiconductor device manufacturing plant, the system comprising:

a material supply source; and a controller for controlling the supply of the material from a supply source to a plurality of processing facilities, such that the material is not used simultaneously by a plurality of processing facilities by controlling a start timing from which the material is supplied to a processing facility.

In the material supply system in the second aspect according to the present invention, it is preferable that at least two of the plurality of processing facilities are adapted to send to the controller use request signals for requesting to start using the material, and use end signals for notifying the end or an end notice of use of the material, and the controller is adapted to respond to the use request signal associated with the material currently used in at least one processing facility from another processing facility by delaying sending a use permission signal for permitting the other processing facility which has sent the use request signal to use the material, until the controller receives the use end signal from the processing facility which is using the material.

It is preferable that the material supply source is a pure water producing for producing a plurality of quality grades of pure water, and the controller is adapted to control the supply of pure water to the processing facilities on a grade-by-grade basis in the supply system in each of the first and second aspect according to the invention.

The present invention, in a third aspect, further provides a material supply system for supplying a gas, liquid or solid material to processing facilities in a semiconductor device manufacturing plant, the system comprising:

a material supply source;

a buffer for temporarily storing the material; and a controller for controlling the supply of the material from the buffer to the processing facilities.

In the material supply system in the third aspect, it is preferable to further comprise control means for controlling the state of the material in the buffer, and/or measuring means for measuring the state of the material in the buffer. In addition, it is preferable to further comprise means for quantifying the amount of the material required at least in single batch processing by one of the processing facilities. Further, it is preferable that the buffer is adapted to simultaneously store at least two kinds or more of materials, and the system is adapted to supply the materials in the same buffer to the same processing facilities.

In the material supply system in the third aspect according to the invention, it is preferable that materials react in the buffer to produce a new material, and the new material are supplied to the processing facilities from the buffer. Further, it is preferable to further comprise control means for controlling the temperature, the pressure, and/or the concentration of a material component in the buffer. It is preferable that an etching gas is stored in the buffer, and the supply system further comprises means for supplying the etching gas to cleaning chambers in the processing facilities. It is preferable that pure water is stored in the buffer, and the supply system further comprises means for supplying the pure water to chambers in the processing facilities. It is preferable that the material supply system further comprises means for recovering the material discharged from a chamber at least one of the processing facilities to store the recovered material in the buffer.

In the material supply system in each of the first, second and third aspects according to the invention, it is preferable that the supply system is adapted to supply the material from a single supply source to a plurality of processing facilities. In this case, it is preferable that the supply source includes a buffer for temporarily storing the material.

The invention also provides a semiconductor device manufacturing plant having a plurality of processing facilities, comprising:

a material supply system in any one of the first through third aspects;

database for logging and managing processes in each of the processing facilities; and a CIM-based control system for totally controlling the semiconductor device manufacturing plant, wherein the control system sets a supply rate at which the material supply system supplies the material to the processing facilities, and priorities for supplying the material among the processing facilities based on an operation schedule for the processing facilities, and a semiconductor device manufacturing schedule on the database.

BRIEF DESCRIPTION OF THE DRAWINGS

FIG. 4 is a table showing exemplary grades of pure water required respectively by cleaning equipments, a CMP equipment and a lithography equipment which constitute points of use;

FIGS. 5A and 5B are explanatory diagrams-showing an exemplary relationship between the amounts of ultrapure water required by two large cleaning equipments and the possibility of using the ultrapure water;

FIGS. 6A and 6B are explanatory diagrams showing an exemplary relationship between the amounts of primary pure water required by two large cleaning equipments, two small cleaning equipment, and one lithography equipment for the respective apparatuses and five CMP equipment and the possibility of using the primary pure water;

FIG. 7 is a flowchart illustrating an exemplary operation for controlling supply of pure water, executed in a controller which is provided in the pure water supply system illustrated in FIG. 2;

FIGS. 11A and 11B are explanatory diagrams each illustrating a method of introducing a material from a liquid source and a solid source to the buffer, respectively, in the LPCVD equipment illustrated in FIG. 8;

BEST MODE FOR CARRYING OUT THE INVENTION

First Embodiment

Figure 1:
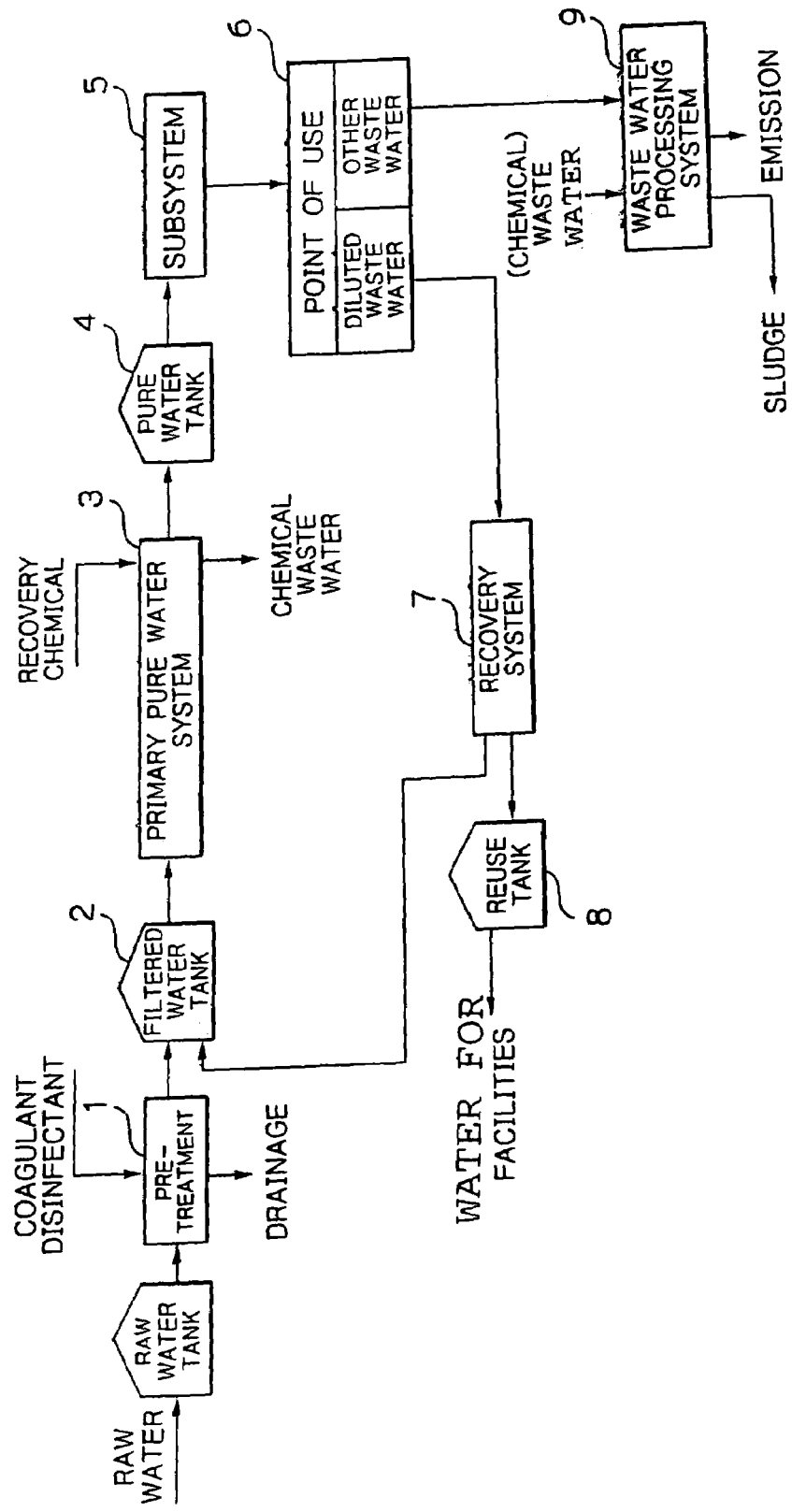
FIG. 1 is a block diagram illustrating a configuration of a conventional pure water system.

In the following, a pure water supply system for supplying pure water to a plurality of processing facilities will be described as a first embodiment of a material supply system in a semiconductor device manufacturing plant according to the present invention.

The inventors investigated into pure water supply systems and particularly noted the following aspects.

At point of use which use pure water, every point of use requires a different quality of pure water. In other words, not all the points of use do require an ultrapure water level for the water quality.

Some of points of use which use pure water require different qualities of pure water on a process-by-process basis, and do not require the ultrapure water level for the water quality in all processes.

Since a small-scaled plant has a relatively small number of points of use, complicated piping is not involved in providing a plurality of quality grades for pure water and routing a pure water supply pipe for each grade.

Classification of pure water by grade can reduce the amount of produced pure water such as ultrapure water which entails a high production cost.

Since a small-scaled plant has a relatively small number of points of use, it is possible to readily know how pure water is used at each point of use.

Since a small-scaled plant has a relatively small number of points of use, the supply of pure water can be readily controlled among the points of use.

At each point of use, pure water is used for a short time ranging from several tens of seconds to several minutes, which translates to several percent to several tens of percent of an overall process (in operation), in an intermittent or periodic pattern. In addition, since pure water is used at a relatively small number of points of use, there is an extremely low probability that a plurality of points of use simultaneously require the same grade of pure water. Moreover, a pure water use pattern (including the grade, amount, and used time) can be readily found for the overall plant.

Even if pure water is required simultaneously at several-points of use, the pure water is used for an extremely short time at each point of use on each occasion. Therefore, the production efficiency is hardly affected in the overall plant even if a point of use is kept waiting for the supply of pure water until another point of use finishes using pure water.

Since the amount of instantaneously required pure water can be reduced by detecting the amount of pure water used at each-point of use, the pure water system can be reduced in scale through such control.

As described above, in a small-scaled plant, there is an extremely low probability of a plurality of point of use simultaneously using the same grade of pure water. Even if the pure water is required simultaneously at several points of use, the pure water is used for an extremely short time at each use point on each occasion, so that the production efficiency is hardly affected in the overall plant even if the points of use are supplied with the pure water in order that in such a manner one point of use is kept waiting for supply of pure water until another point of use finishes using the pure water. Also, a pure water production cost can be reduced without exacerbating the production efficiency by detecting the amount of each grade of pure water required by each point of use to provide a maximum of the detected amounts of pure water (amount of instantaneously required pure water). Furthermore, the amount of instantaneously required pure water can be reduced by detecting and controlling the amounts of used pure water among the points of use, thereby reducing the pure water supply system in scale.

As described above, the pure water supply system, which is one embodiment of a material supply system according to the present invention, is created based on the results of analyses on pure water which is simultaneously used at several points of use in a semiconductor device manufacturing plant and analyses on quality grades of pure water required at the points of use for respective processes.

Figure 2:
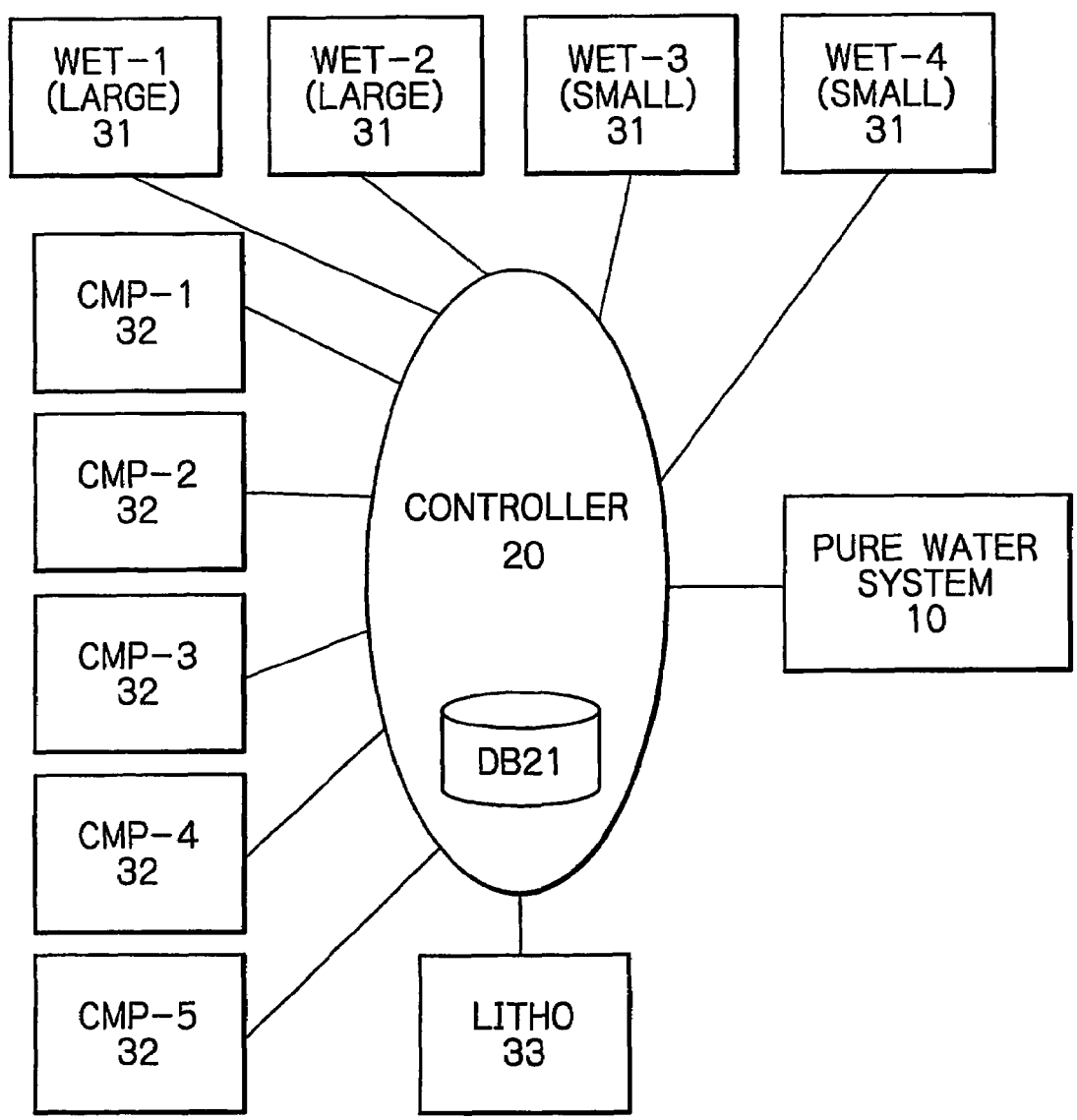
FIG. 2 is a block diagram illustrating a configuration of a pure water supply system which is one embodiment of a material supply system according to the present invention.

FIG. 2 is a block diagram schematically illustrating a configuration of a pure water supply system according to the present invention which is particularly useful in a small-scaled plant. The illustrated pure water supply system comprises a pure water system 10 for producing a plurality of quality grades of pure water; a controller 20 for controlling supply of pure water; and equipments 31-33, i.e, points of use which require pure water in a semiconductor device manufacturing plant. The exemplary pure water supply system includes four cleaning equipments (i.e., two large cleaning equipments WET1, WET2 and two small cleaning equipments WET3, WET4)31; five chemical mechanical polishing equipments (CMP1-CMP5) 32; and one lithography equipment (LITHO) 33 as points of use. These equipments are simply called the "points of use 30" when they are collectively treated. The controller 20 comprises a pure water use database (DB) 21 which stores control information such as information communicated between the controller 20 and pure water system 10, information communicated between the controller 20 and each points of use 30, and the like for storage of a pure water supply/use log. The information may be communicated through an arbitrary communication means such as LAN within the plant.

It should be noted that supply piping for supplying pure water, and piping and recovery processing apparatuses for recovering dilute waste water discharged from the points of use 30 for recirculation to the pure water system are omitted in FIG. 2 so as to simplify the description.

It should also be understood that a plurality of points of use 30 in the small-scaled plant are not limited to the aforementioned types and numbers of equipments.

Figure 3:
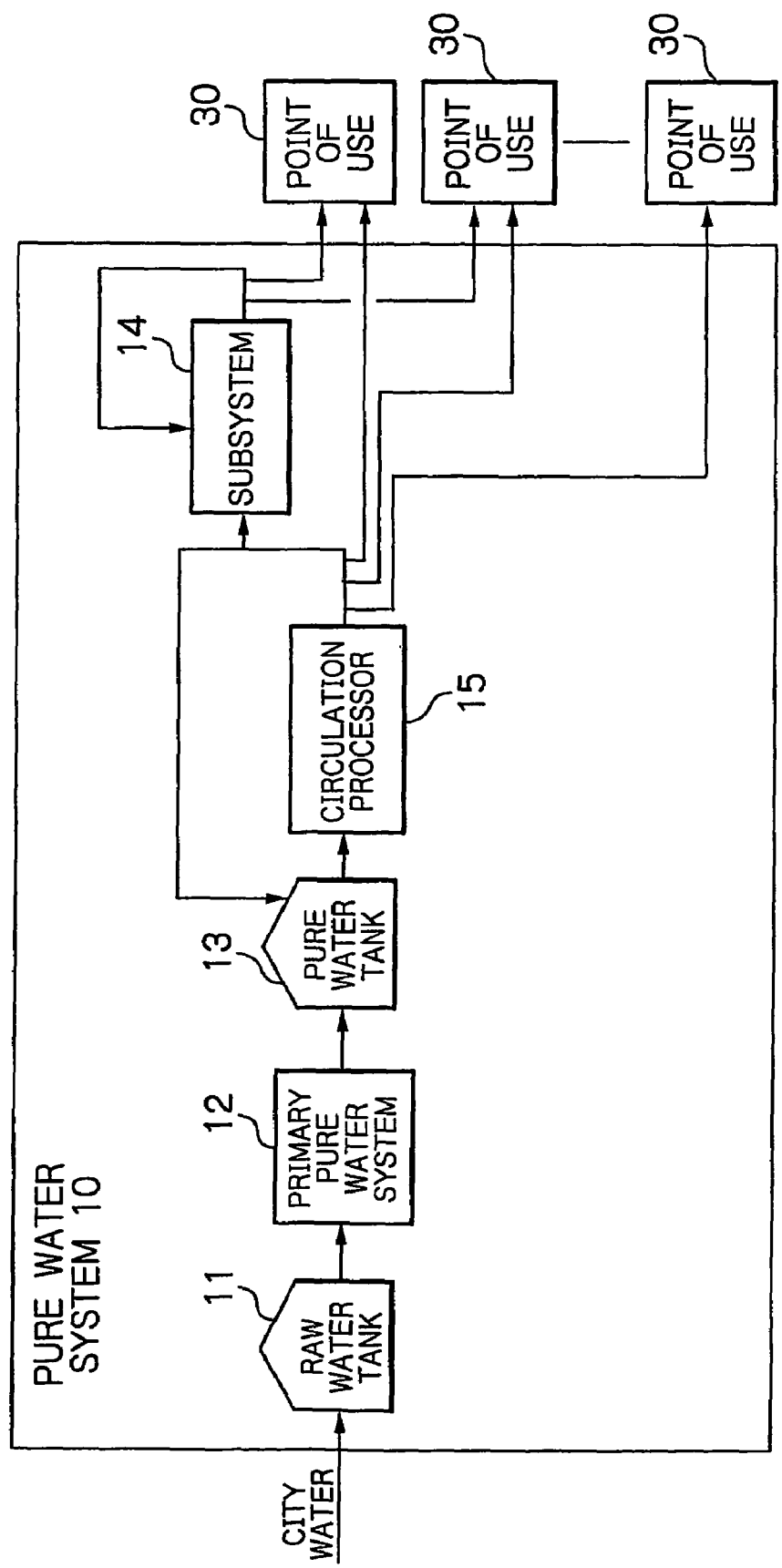
FIG. 3 is a block diagram illustrating a configuration of a pure water system provided in the pure water supply system illustrated in FIG. 2.

As illustrated in FIG. 3, the pure water system 10 comprises a raw water tank 11, a primary pure water system 12, a pure water tank 13, a subsystem (ultrapure water producer) 14, and a circulation system 15. In the exemplary configuration illustrated in FIG. 3, the pure water system 10 uses city water for the raw water. Alternatively, as in the prior art example illustrated in FIG. 1, industrial water may be used for raw water which is filtered by a pretreatment system or the like to provide filtered water. Since a small-scaled plant uses a small amount of raw water, city water is preferably used for the raw water because it does not require an intricate pretreatment step. The primary pure water system 12, pure water tank 13 and subsystem 14 are similar to those provided in the prior art pure water system illustrated in FIG. 1.

The circulation system 15 controls the pure water tank 13 and points of use 30 to circulate at all times an amount of primary pure water which ensure an instantaneously required amount (which permits a plurality of points of use 30 to simultaneously use the pure water) across a piping system. Specifically, through the control of the circulation system 15, the primary pure water flows through the piping system at all times in the instantaneously required amount plus a margin, such that each point of use 30 takes in a required amount of primary pure water from the piping system for use at a time it requires pure water, and primary pure water not used is returned to the pure water tank 13. The circulation system 15 preferably comprises a heat exchanger for cooling the primary pure water which is heated during circulation, a UV lamp device for sterilization and an ultrafiltration membrane(UF). The UV lamp device for sterilization entails a sufficiently low initial cost and running cost, as compared with a UV lamp device for TOC decomposition typically provided in the subsystem 14, so that the installation of the circulation system 15 results in an extremely small rise in pure water production cost. Also, since the pure water tank 13 is installed at a location downstream of the primary pure water system 12 for storing the primary pure water, the primary pure water system 12 can produce an amount of primary pure water which is set to an average amount (minimum amount) required by the overall plant.

The foregoing components, which make up the pure water system 10, are preferably implemented by separate functional modules which can be operated independently of one another. Such separate functional modules allow for adaptable ultrapure water supply because a change in an ultrapure water use condition required by a particular point of use, caused by a replacement of any production facilities in the plant, can be accommodated by adapting or replacing only required functional modules. In addition, since the modular functional units can be manufactured on a module basis in a module manufacturing plant, a reduction in construction time and cost can be accomplished by installing the pure water system in a plant.

Preferably, the primary pure water system 12 and subsystem 14 in the pure water system 10, are implemented by devices which use at least membrane processing techniques. In particular, the primary pure water system 12 preferably comprises a reverse osmosis membrane device, a degas membrane device, and an electric deionization device.

The conventional primary pure water system 3 illustrated in FIG. 1 generally produces the primary pure water mainly based on any of an ion exchange resin method, a combination of the ion exchange resin method with a reverse osmosis membrane, and a combination of the reverse osmosis membrane with an ion exchange resin method, with a vacuum degasifier combined therewith.

However, the ion exchange resin method which dominates the processing has the following problems when it is directed to a small-scaled semiconductor plant or a small-scaled plant intended by the present invention, even though it is a low-cost, well-established technique for producing a large amount of primary pure water over 100 $m^3$/h for a large-scaled semiconductor device manufacturing plant or a large-scaled plant.

Since the ion exchange resin method adsorbs impurities to an ion exchange resin for purification, a restore operation must be done approximately once a day for removing the impurities from the ion exchange resin. As such, the ion exchange resin method involves a complicated operation management, and since no primary pure water can be produced during the restore operation, primary pure water must be previously produced and stored in a tank such that pure water is available even during the restore operation.

In a small-scaled plant, the pure water supply system tends to occupy a large percentage of the plant area. However, the pure water system must be provided with a primary pure water system 12 and a pure water tank 13 having large capacities in order to reserve primary pure water for use in the restore operation, leading to a further increase in the area required for the pure water supply system. In addition, the recovery of the ion exchange resin involves the use of a large amount of chemicals which must be carefully handled, such as base, caustic soda and the like, and the production of a large amount of strong acid and strong alkali chemical waste water which requires a complicated waste water treatment.

Moreover, the vacuum degasifier must be approximately 10 meters high, irrespective of the processing capacity, and requires a dedicated cradle for installation, so that careful attention should be paid to the building construction.

On the other hand, the electric deionization device suitable for the primary pure water system 12 in the pure water system according to one embodiment of the present invention is free from the aforementioned problems associated with the ion exchange resin method, and can continuously produce highly pure water, when combined with a reverse osmosis membrane, without the need for chemicals used in the regeneration. Also, when a degassing membrane is installed between the reverse osmosis membrane and electric deionization device, it can deoxidize as well as decarbonate without the problems associated with the vacuum degasifier as mentioned above, to reduce an ion load on the electric deionization device, permitting a continuous supply of highly pure water to be readily produced.

While any commercially available electric deionization device can be employed for use as the primary pure water system 12, an electric deionization device (manufactured by Ebara Corporation under the product name of GDI) disclosed in WO99/48820 or Japanese Patent Public Disclosure No. 2001-121152 is preferably employed for simplification of the system configuration.

When GDI is employed, one reverse osmosis membrane is needed only in front of GDI because GDI is by nature not prone to precipitation of hardness components. Thus, unlike other electric deionization devices, GDI does not need two reverse osmosis membranes for mostly removing hardness components or a combination of a reverse osmosis membrane with a water softener.

Further, since GDI excels in removal of total organic carbon (TOC), water processed by GDI can readily achieve TOC equal to or less than 15 ppb which is an indicator of primary highly pure water. Other electric deionization devices exhibit low TOC removal characteristics and may suffer from elution of TOC from an ion exchanger filled in the electric deionization devices. Therefore, for holding TOC at 15 ppb or lower with stability, a reverse osmosis membrane for removing TOC or an ultraviolet irradiation device for decomposing TOC should be provided subsequent to the electric deionization device to produce similar results, though the resulting system is rather complicated.

It should be understood that an arbitrary electric deionization device other than GDI is employed for the primary pure water system 12, and that an arbitrary pure water systemsuch as the conventional system illustrated in FIG. 1-4 is applicable to the pure water system 10 in the present invention.

Each of the point of use 30 operates independently of one another as long as it uses each quality grade of pure water within its limits. For example, a large cleaning equipment, a small cleaning equipment, a CMP equipment and a lithography equipment require quality grades of pure water, respectively, as shown in FIG. 4. Even when supply pipes are routed to provide a plurality of quality grades of pure water, the piping system is not so complicated because the small-scaled plant has only a small number of points of use 30.

In operation, each of the points of use 30 communicates a "use request signal" to the controller 20 for using a particular quality grade of pure water as shown in FIG. 4 in accordance with a preset pure water use pattern. The use request signal includes information declaring that a particular point of use 30 desires to start using pure water, as well as an equipment ID indicative of a point of use 30 which transmits the signal, a grade ID indicative of a particular grade of desired pure water, the amount of water, a use time (period), and the like, by way of example.

Alternatively, the information related to a use time may not be included in the use request signal, and a "use end signal" may be sent from the point of use 30 to the controller 20. The use end signal may include information indicative of the end of use of pure water or a notice of the end, and an equipment ID.

When the pure water use DB 21 (or another arbitrary storage device) of the controller 20 stores a pure water use pattern for each point of use 30 along which the processing is advanced at each point of use 30, the use request signal need not include the grade ID (or the grade ID, amount of pure water, use time (period)).

Based on the received signals, the controller 20 determines a timing at which an associated point of use 30 can use an appropriate grade of pure water circulated through supply pipes from the pure water system 10, and notifies the point of use 30 of a "use permission signal" indicative of permission for use of pure water at the determined timing. The controller 20 may be configured to control the operation of a recovery processing (not shown) and the pure water system 10 themselves.

The following description will be centered on the ability to reduce the amount of instantaneously used pure water for providing a reduction in the scale of the pure water system through the control conducted by the controller 20 with reference to a specific example.

The large cleaning equipments (WET1, WET2) 31, which are examples of the points of use, use ultrapure water for final rinse water, as shown in FIG. 4, however, these cleaning equipments 31 use the pure water in approximately 40% of their overall operations, and use the final rinse water, i.e., the ultrapure water in approximately 17% of their overall operations. Therefore, as shown in FIGS. 5A and 5B, when the two large cleaning equipments simultaneously operate, they will need the ultrapure water during the same time period with the possibility of approximately 1% (when viewed from an overall operating time of the semiconductor plant). One of the large cleaning equipments requires the ultrapure water for its operation for approximately 11% of the overall operating time. In the remaining 88% of the operating time, any of the two large cleaning equipments is not operating in a final rinse step, so that the ultrapure water is not required at all. From the foregoing, when the two large cleaning equipments simultaneously request for the ultrapure water, the second requesting cleaning equipments is kept waiting for the supply of ultrapure water. In this way, the subsystem (ultrapure water producer) 14 of the pure water system 10 can be reduced in scale to 20 liters per minute (L/m) which is essentially the amount supplied to one cleaning equipment.

A primary water supply system, i.e., the primary pure water system 12, pure water tank 13 and circulation system 15 can also be reduced in scale in a similar manner. Specifically, as shown in FIG. 4, the primary pure water is required by four cleaning equipments 31, five CMP equipments 32, and one lithography equipment 33, all of which constitute points of use. The percentage of an operating time requiring the primary pure water to an overall operating time, and the amount of required primary pure water at each of the points of use 30 are, for example, as shown in FIGS. 6A and 6B. Based on the percentages of operating times and the amounts of required primary pure water shown in FIG. 5, the required primary pure water amounts to 50 L/m with possibility of 30%, and to 100 L/m at maximum with possibility of 76% (=30+46), and to 150 L/m at maximum with possibility of 97% (=30+46+21).

Therefore, it is not necessary to provide a primary pure water system which is capable of supplying the primary pure water at 176 L/m which is a simple sum of the amounts of primary pure water required by the respective points of use 30. Rather, the primary pure water supply system only needs to have the capability of supplying the primary pure water at 50 L/m, 100 L/m or 150 L/m depending on how many points of use are permitted to simultaneously use the primary pure water, thereby reducing the scale of the primary pure water supply system. For example, with the primary pure water supply system capable of supplying the primary pure water at 100 L/m, when an additional point of use requests for the primary pure water while two point of use 30 are using the primary pure water, the last requesting point of use may be kept waiting for the primary pure water. Such simultaneous use requests can be made with possibility of as low as approximately 21% in the example of FIGS. 6A and 6B, and moreover, the primary pure water is requested only for a short time period, so that the foregoing control strategy will hardly affect the processing in the overall plant.

As is apparent from the foregoing, according to the present invention, the pure water can be supplied without impediments to the manufacturing of semiconductor devices even with small capabilities of supplying the primary pure water and ultrapure water, as long as the pure water is supplied to each point of use 30 from an appropriately controlled start timing.

The pure water supply control operation performed by the controller 20 in accordance with the present invention will be described in greater detail with reference to a flow chart of FIG. 7. This control is executed by a software program installed in a computer.

As a plurality of points of use 30 in the plant start operating independently of one another after the opening of the plant, the controller 20 waits for a use request signal and a use end signal at step S1. In this event, the use request signal includes information indicative of an equipment ID, a grade ID and the amount of required pure water, while the use end signal includes an equipment ID.

Upon receipt of the use request signal, the program proceeds to step S2 where the controller 20 searches the pure water use DB 21 based on the grade ID of pure water in the use request signal to determine whether or not the requested grade of pure water is now being used by any point of use. When the requested grade of pure water has already been used, the program proceeds to step S3 where the controller 20 determines from the capability of the pure water system 10 to supply the requested grade of pure water whether or not the amount of pure water requested by the use request signal can be immediately supplied to a requesting point of use.

At step S3, the controller 20 searches the pure water use DB 21 to determine whether or not another point of use is waiting for the requested grade of pure water, and determines that the grade of pure water cannot be supplied in the requested amount if such a point of use already exists. On the contrary, if no other point of use is waiting for the requested grade of pure water, the controller 20 determines that the grade of pure water can be supplied. In addition, when no other use point is waiting, the controller 20 determines from the capabilities of the pure water system 10 to supply pure water whether or not the pure water system 10 can supply the grade of pure water requested by the newly requesting use point 30.

When the controller 20 determines at step S2 that the requested grade of pure water is now in use and determines at step S3 that the requested grade of pure water cannot be supplied, the controller 20 sends a wait instruction signal to the associated point of use 30 at step S4 for instructing the point of use 30 to wait for the requested grade of pure water, and writes a waiting mark into the pure water supply DB 21 in association with the equipment ID and grade ID. In this event, the controller 20 also stores the requested amount of pure water in the pure water use DB 21.

On the contrary, when the controller 20 determines at step S2 that the requested grade of pure water is not in use, or when the controller 20 determines at step S3 that the requested grade of pure water can be supplied, the controller 20 writes a supply start mark into the pure water use DB 21 in association with the equipment ID and grade ID in the use request signal, and stores the requested amount of pure water. In addition, the controller 20 sends a use permission signal to the point of use 30 corresponding to the equipment ID, thereby permitting the point of use 30 to use the requested grade of pure water.

On the other hand, when the controller 20 receives a use end signal at step S1, the program proceeds to step S6 where the controller 20 writes a supply end mark in the pure water use DB 21, in association with the equipment and grade IDs. Then, at step S7, the controller 20 searches the pure water use DB 21 for an equipment ID which is given a waiting mark in association with the grade ID. The program proceeds to step S8 when such a waiting mark is found, and returns to step S1 if not, where the controller 20 again waits for another signal. At step S8, the controller 20 reads from the pure water use DB 21 the amount of pure water which is stored in association with a grade ID that has been given a waiting mark at the earliest time point with respect to the grade ID. Then, the program proceeds to step S2, where the controller 20 determines, as described above, whether or not another use point is using the grade of pure water, followed by execution of steps S3 to S5.

In the foregoing manner, the controller 20 determines, from the capabilities of the pure water system 10 to supply respective grades of pure water, whether or not a requested grade of pure water can be immediately supplied to a requesting use point 30 in a requested amount. The controller 20 does not permit the point of use 30 to use the pure water when not available, until the pure water system 10 can supply the pure water. In this way, even when the pure water system 10 is relatively limited in the capabilities of supplying each grade of pure water, products can be manufactured without substantially degrading the production efficiency of the products.

The operation for controlling the supply of pure water described above is based on the premise that a plurality of points of use 30 can simultaneously use the same grade of pure water within the capabilities of the pure water system 10 to supply pure water. Alternatively, the supply of pure water may be controlled such that two or more points of use 30 are not at all permitted to use the same grade of pure water. In this event, when the controller 20 receives a use request signal from a certain point of use for a grade of pure water which has already been used by another point of use, the controller 20 may not transmit a use permission signal to the former point of use until a use end signal is sent from the latter point of use.

Also, as previously described, when the use request signal includes information on a use timeperiod, the use end signal need not be communicated from the point of use 30 to the controller 20, in which case the controller 20 waits only for the use request signal at step S1, resulting in elimination of the processing at steps S6 to S8 in FIG. 7. Further, when the controller 20 has previously known how long each point of use 30 will use pure water, the controller 20 may automatically determine that the point of use 30 has finished using the pure water in a predetermined time after the point of use 30 has started using the pure water. In this event, the point of use 30 does not need to send the use end signal as well.

Preferably, points of use which do not simultaneously request for the same grade of pure water are collected into a group. In this event, the group preferably includes at least two equipments having the same function, i.e., which continuously perform processing. This is because a randomly created group would experience difficulties in reconstruction thereof, as would be needed when some equipments are exchanged, and would fail to sufficiently exert the effect of reducing the amount of supplied pure water without adversely affecting the production efficiency.

While a preferred embodiment of the material supply system according to the present invention has been described in connection with a pure water supply system, it should be apparent to those skilled in the art that a variety of modifications can be made thereto. For example, in the exemplary pure water supply system, the controller 20 returns a wait instruction signal to a point of use 30 which has sent a use request signal when the controller 20 does not immediately permit the use point 30 to use requested pure water. However, the controller 20 does not necessarily return the wait instruction signal. Also, the use permission signal may be used to open a pure water take-in valve associated with the requesting point of use 30. Further, it should be understood that the present invention is not limited to pure water supply but may be applicable to supply of an arbitrary gas, liquid or solid material.

Second Embodiment

Figure 8:
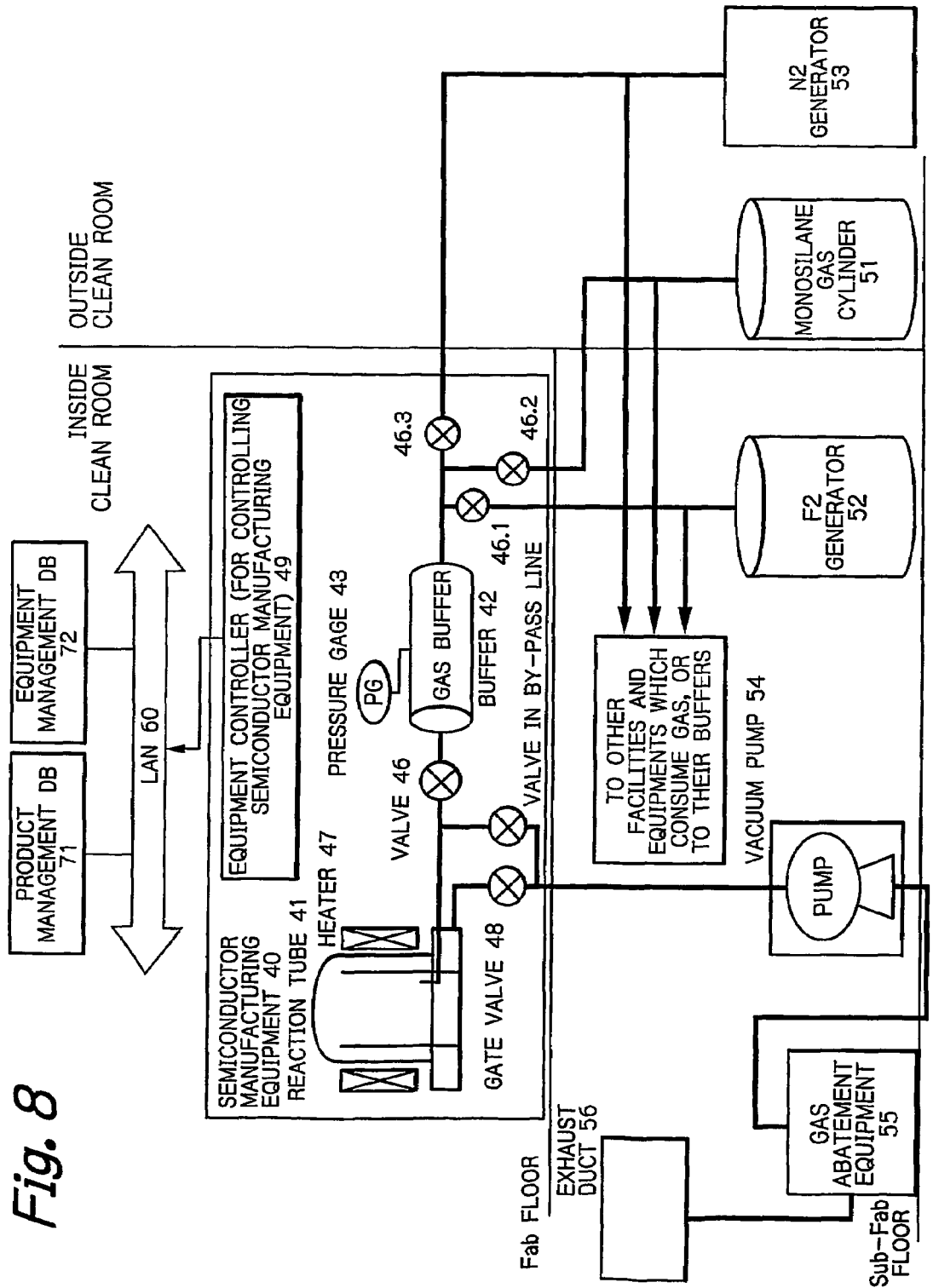
FIG. 8 is a diagram conceptually illustrating a material supply system for supplying a material to a polycrystalline or non-crystalline silicon film LPCVD equipment according to another embodiment of the present invention.

FIG. 8 illustrates a material supply system for use with a silicon film LPCVD equipment (Low Pressure Chemical Vapor Deposition) for performing an LPCVD process using a monosilane gas in accordance with a second embodiment of the present invention.

The LPCVD equipment (semiconductor manufacturing) 40, which is one of processing facilities in a semiconductor device manufacturing plant, is installed on a Fab floor within a clean room which also contains a reaction tube 41 or chamber made of highly pure quartz. The reaction pipe 41 is supplied with a monosilane gas which is a material gas for use in the LPCVD deposition, and a fluorine gas for etching silicon films deposited on the inner wall of the reaction tube 41, other contained quartz, and surfaces of parts made of silicon carbide to clean the interior of the reaction tube 41. These gases are introduced from a monosilane gas cylinder 51 installed outside the clean room and a fluorine gas generator 52 installed on the floor below (SUB-Fab floor) within the clean room, respectively, through a buffer (gas buffer) 42. Pipes for introducing the monosilane gas and fluorine gas to the buffer 42 are closed by air operation valves 46.1, 46.2, respectively, and a pipe connecting the buffer 42 to the reaction tube 41 is closed by a similar air operation valve 45.

An operation for supplying the fluorine gas for cleaning will be described later in a third embodiment.

A pressure gage 43 measures a pressure at which the buffer 42 is filled with a gas. For purging the interior of the buffer 42 and reaction tube 41, a dilute gas produced during a reaction is supplied, or a nitrogen gas is supplied from a nitrogen gas generator 53 through a valve 46.3 for restoring the pressure within the reaction tube 41 to the atmospheric pressure. A gas supplied from the buffer 42 to the reaction tube 41 is heated therein, and exhausted therefrom by a vacuum pump 54 installed on the floor below in the clean room through a gate valve 48 which has both a function of adjusting the pressure within the reaction tube 41 and a shut-down function, after an LPCVD reaction or an etching reaction, together with gases produced by the reaction and the unreacted gas, by adjusting the conductance of the fluid with the opening of the valve 46.3. The exhausted gas is discharged from an exhaust duct 56 provided in the clean room after it is rendered harmless by an gas abatement equipment 55.

A semiconductor wafer under processing is placed within the reaction tube 41 in which the LPCVD reaction takes place, and the reaction tube 41 is heated by a heater 47 in this state. The valves 45, 46.1-46.3, 8, heater 47, fluorine gas generator 52, vacuum pump 54, and gas abatement equipment 56 are controlled by an equipment controller 49 for performing and managing the LPCVD process. The outputs of the pressure gage 43 and heater 47, the temperature within the reaction tube 41, the pressure within the reaction tube 41, and the like are also applied to the controller 49. Information on deposition is output from a product management database (DB) 71 to the equipment controller 49 through a LAN 60.

Deposition of a polycrystalline silicon film is performed using the LPCVD equipment 40 illustrated in FIG. 8 as described below. Before an unprocessed semiconductor wafer reaches the process in the LPCVD equipment 40, detailed information on the LPCVD process performed by the LPCVD equipment 40 is applied to the equipment controller 49 from the product management database 71. For example, assuming that the LPCVD process deposits a polycrystalline silicon film of 100 nm thick at 620° C. and 0.2 Torr for ten minutes using a monosilane gas at a flow rate of 100 sccm, the total amount of monosilane gas used for the deposition is calculated by:

$$100 \text{ SCCM} \times 10 \text{ minutes} = 1000 \text{ SCC}$$

It is assumed that the buffer 42 associated with the LPCVD equipment 40 has an inner volume of 1000 cc. Under the control of the controller 49, after the valve 45 is once opened, the buffer 42 is evacuated to a sufficiently low pressure by the vacuum pump 54. Then, the valve 45 is closed and the valve 46.2 is next opened to introduce the monosilane gas into the buffer 42. After the buffer 42 is filled with 1000 SCC of the monosilane gas (a volume of 1000 cm$^3$ under a standard gas state), the valve 46.2 is closed to shut off the buffer 42.

Figure 9A:
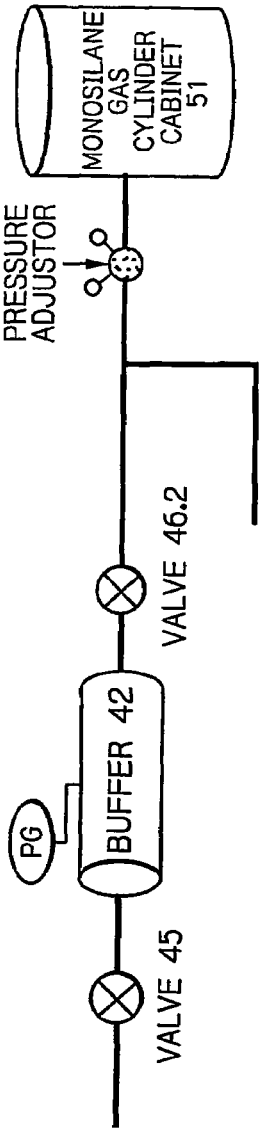
FIGS. 9A to 9C are explanatory diagrams each illustrating an exemplary method of measuring a monosilane gas when it is introduced from a cylinder cabinet to a gas buffer in the LPCVD equipment illustrated in FIG. 8.
Figure 9B:
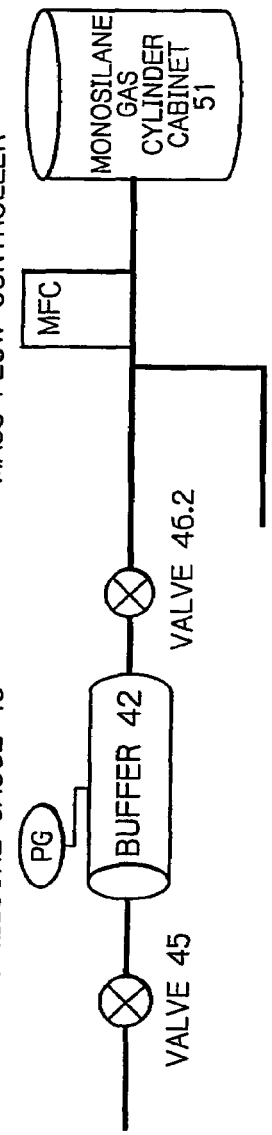
Figure 9C:
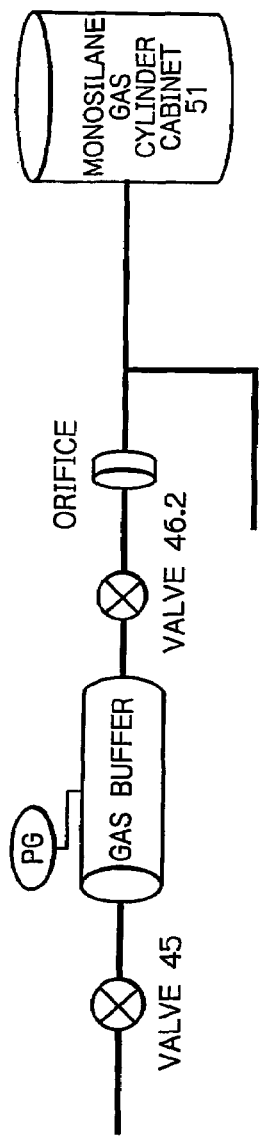

The monosilane gas filled in the buffer 42 can be controlled by a variety of methods. FIGS. 9A-9C show three exemplary alternatives.

FIG. 9A shows a method of adjusting the pressure within the buffer 42. Specifically, this method entails a pressure reducing valve disposed upstream or downstream of the valve 46.2 for automatic adjustment to a desired pressure in response to an instruction from the equipment controller 49.

In this event, the pressure reducing valve adjusts the pressure within the buffer 42 at atmospheric pressure, and 1000 SCC of monosilane gas is measured.

FIG. 9B shows a method of measuring 1000 SCC of monosilane gas by the flow rate and time using a mass flow controller (MFC) disposed upstream or downstream of the valve 46.2. For example, the monosilane gas is constantly supplied at a flow rate of 2 SLM for 30 seconds. Here, a more economical mass flow meter may be used instead of the mass flow controller to measure 1000 SCC of monosilane gas from an accumulation value output therefrom.

FIG. 9C shows a method of controlling the pressure within the buffer 42 by measuring the pressure within the buffer 42 using the output of the pressure gage 43 mounted to the buffer 42, and closing the valve 42.6 when the pressure reaches a desired value, 1 hPa (=760 Torr) in this event. When the pressure rapidly increases, an orifice or the like may be provided for reducing the conductance of the fluid, or a piezo valve may be provided for adjusting the conductance through its opening, to control the pressure within the buffer 42 to 760 Torr with the opening fed back from the value of the pressure gage 43.

In the methods described above, the pressure adjuster, mass flow controller, and/or conductance controller may be disposed upstream of a location at which the monosilane gas is branched to other s, such that these devices, which are relatively expensive parts, can be shared by a plurality of semiconductor manufacturing equipments such as the LPCVD equipment and the like. When the flow rate is not measured using the mass flow controller or mass flow meter as in the methods shown in FIGS. 9A and 9C, the gas must be at a standard temperature and a standard pressure for precisely controlling the total flow rate. In this event, therefore, a pressure set value must be corrected by adjusting or measuring the state or the temperature of the buffer 42. It is critical to select an optimal combination from the balance between a particular application and required specifications and cost of a product.

In any of the methods described above, the monosilane gas can be supplied in a shorter time period irrespective of an actual time taken for the deposition, so that the monosilane gas cylinder cabinet 51 may be actually connected to the LPCVD equipment 40 for a shorter time period. In addition, the monosilane gas may be supplied before the deposition is actually started to significantly reduce the influence of a failure or a reduction in the supply due to accidents, faults, and artificial mistakes in the plant on the actual LPCVD manufacturing process, thereby providing for stable manufacturing. On the other hand, the monosilane gas may be supplied slowly for a longer time than the time required for deposition using more economical apparatuses than conventional supply facilities in terms of the space and cost.

After the buffer 42 is filled with the monosilane gas, or in parallel with this operation, an unprocessed substrate is introduced into the reaction tube 41. After the reaction tube 41 is evacuated, the temperature and pressure are adjusted to desired values, here 620° C. and 0.2 Torr, respectively. Also, other preparatory operations should be progressed prior to the deposition.

Figure 10A:
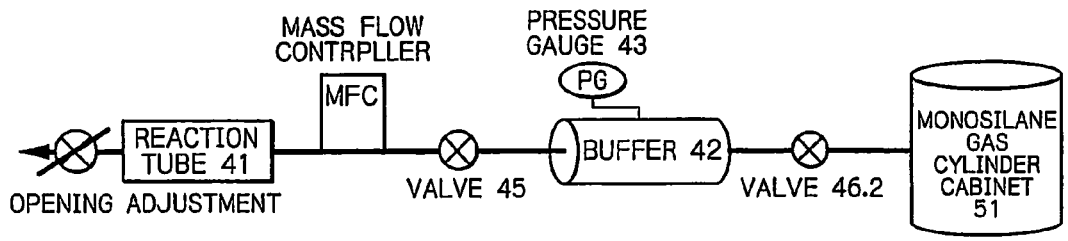
FIGS. 10A to 10C are explanatory diagrams each illustrating an exemplary method of introducing a monosilane gas from a monosilane gas buffer to a reaction tube in the LPCVD equipment illustrated in FIG. 8.

For the deposition, a mass flow controller may be disposed downstream of the valve 45 to control the flow rate (see FIG. 10A). Alternatively, the valve 45 may be provided with an additional function of adjusting the conductance with its opening, or a valve capable of adjusting the conductance, such as a piezo valve may be used in combination to adjust the opening to constantly reduce the output value of the pressure gage 43 mounted to the buffer 42 (in this event, substantially at a rate of 76 Torr/min because the monosilane gas at 760 Torr is used up in ten minutes), thereby making it possible to control the flow rate without using the mass flow controller (see FIG. 10B). By thus controlling the flow rate during the deposition, 1000 SCC of monosilane gas for use in the deposition need not be precisely measured beforehand. After the deposition with 100 SCCM of monosilane gas for ten minutes, the remaining monosilane gas can be wasted through a bypass line by the vacuum pump 54, without being passed through the reaction tube 41, or may be saved for the next deposition.

An example is next given, where the present invention is applied to a batch type LPCVD equipment for depositing polycrystalline silicon films on a plurality (generally 100 to 200) of semiconductor wafers disposed in the reaction tube 41 at one time. In a batch type vertical LPCVD furnace, semiconductor wafers are vertically stacked at predetermined intervals (for example, approximately 5 mm) in the reaction tube 41. After the reaction tube 41 is stabilized at a reaction temperature (here, 620° C.), a monosilane gas or material gas is supplied at a controlled flow rate by a mass flow meter or the like. It should be noted that the gas introduced into the reaction tube 41 is consumed in an upstream region to produce reaction product gases, so that the introduced gas has a relatively low concentration in a downstream region to slow down the deposition reaction.

In the embodiment herein illustrated, the monosilane gas is consumed in the deposition reaction and vapor phase reaction to cause the following chemical reactions:

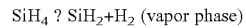

$SiH_4 \rightarrow SiH_2 + H_2$ (vapor phase)

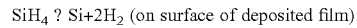

$SiH_4 \rightarrow Si + 2H_2$ (on surface of deposited film)

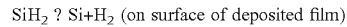

$SiH_2 \rightarrow Si + H_2$ (on surface of deposited film)

Produced $SiH_2$ (silylene gas) and $H_2$ (hydrogen gas) cause a reduction in the partial pressure of $SiH_4$ (monosilane gas) in the downstream to slow down the deposition rate. Therefore, when the monosilane gas is continuously supplied at a certain flow rate (here, 100 SCCM) into the reaction tube 41 which contains a plurality of semiconductor wafers stacked one above the other, the deposition rate is reduced on those positioned on the downstream side for the reason set forth above. The monosilane gas is carried from the peripheries to the centers of the semiconductor wafers by diffusion through narrow spaces between the stacked semiconductor wafers (in this embodiment, narrow spaces of approximately 5 mm), as compared with the radius of the semiconductor wafers. Thus, in this example, the peripheral region corresponds to the upstream side, while the central region corresponds to the downstream side. As a result, the deposition is performed in the peripheral region at a rate higher than in the central region, resulting in a smaller thickness of the deposited film in the central region, which dominates a limitation to the uniformity of deposition, as is well known in the art.

Figure 10B:
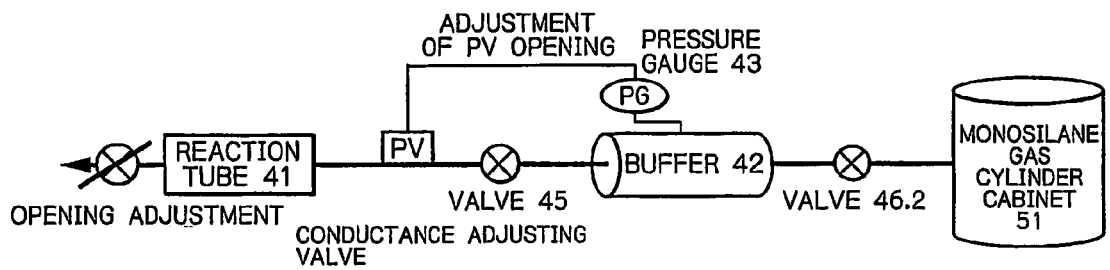
Figure 10C:
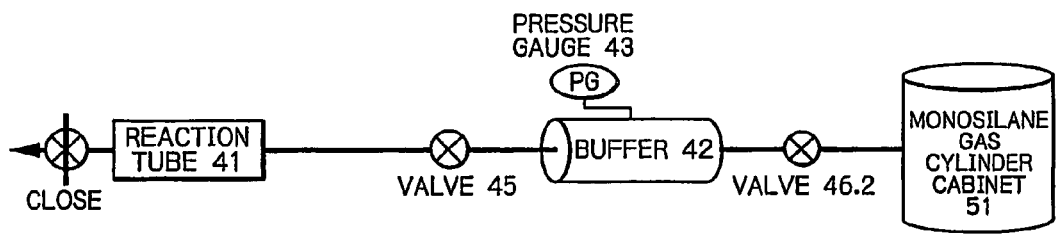

When the flow rate of the monosilane gas from the buffer 42 is controlled during the deposition by a method using a mass flow controller as shown in FIG. 10A or by a method as shown in FIG. 10B, the deposited film is similar in uniformity. However, with the use of the buffer 42, it is possible to control the amount of monosilane gas supplied for use in the deposition by a total amount of introduced gas, without managing the flow rate at all, as shown in FIG. 10C. This control sequence associated with the deposition will be described below.

First, a required amount of monosilane gas is measured and filled in the buffer 42. Then, the reaction tube 41 is sufficiently evacuated by the vacuum pump 54 to 0.1 mTorr, for example, and the gate valve 48 connected to the vacuum pump 54 is completely shut off to enclose the buffer 42. Subsequently, the valve 45 connecting the buffer 42 to the reaction tube 41 is fully opened to fill the reaction tube 41 with the amount of monosilane gas required for the intended deposition in several seconds at a stretch. Even in the narrow spaces between respective wafers, the monosilane gas is filled at a stretch. By thus diffusing the monosilane gas at a rate sufficiently higher than the reaction rate, the deposition can provide a high uniformity in film thickness without causing a non-uniform film thickness due to the diffusion controlled rate of the gas as mentioned above.

Figure 10D:
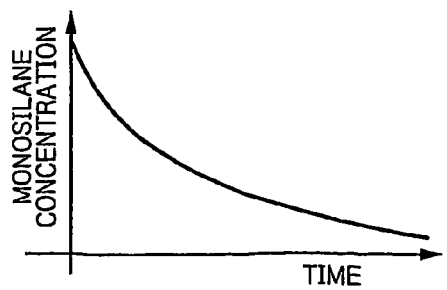
FIG. 10D is a graph showing a change over time in the concentration of the monosilane gas.
Figure 10E:
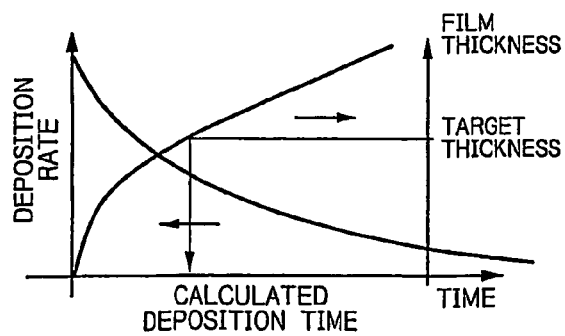
FIG. 10E is a graph showing relationships between a deposition rate and a deposition time, and a target film thickness and a deposition time.

FIG. 10D shows a change over time in the concentration of the monosilane gas, and FIG. 10E shows a change in the deposition rate and a change over time in the thickness of a deposited film. Unlike a general deposition performed with a monosilane gas introduced at a controlled flow rate by a mass flow controller or the like, the deposition rate is not constant. A target film thickness must be found by integrating data on the deposition rate, and determining a deposition time based on the graph shown in FIG. 10E. Since the deposition rate is initially high, gradually decreases, and is very slow near the target film thickness, the film thickness can be controlled more precisely in a short time period with a reduced error in film thickness due to the time variation.

Instead of an undoped silicon film, when a deposited film is doped with impurities which serve as doners or acceptors such as arsenic, boron, phosphorous or the like, or germanium belonging to the same group VI during the deposition, an additional buffer equivalent to the buffer 42 may be previously provided for storing a source gas such as $ASH_3$ (arsine), $BeH_6$ (diborane), $PH_3$ (phosphine), $GeH_4$ (germane) or the like for use in the deposition process in a procedure similar to the process which uses monosilane. Further, these gases may be mixed with a monosilane gas and stored in the same buffer 42 to provide a uniform concentration of dopant. In this event, a mass spectrometer or an infrared absorption spectrometer may be connected to the buffer 42 to output the result of analysis to the equipment controller 49 which controls a lead valve or the flow to the buffer 42 to correctly know the concentration of each of the components before they are used for the deposition to control the concentration of each gas which is to be filled in the buffer 42. Alternatively, the pressure gage 43 may simply measure an increment in the pressure in the buffer 42 as the respective gases are filled in the buffer 42 one by one to calculate a mixture ratio of each gas. Variations in the subsequent deposition are similar to the deposition using a monosilane gas alone.

When the present invention is applied to LPCVD deposition of tantalum oxide using penthaethoxytantalum (hereinafter abbreviated as PET) instead of the deposition of a silicon film using a monosilane gas, a required amount of PET which is a liquid at an atmospheric pressure and a room temperature is measured by a flow control based on a liquid mass flow, weight, level, or the like, and injected into the buffer 42. The buffer 42 may be provided with a heater 47 and a temperature adjuster (not shown) for adjusting the temperature to maintain a state in which PET evaporates but does not thermally react to change PET from a liquid to a gas which can be stored. This process is illustrated in FIG. 11A. The subsequent deposition is similar to that using a monosilane gas. In this way, the amount of gas required for the deposition can be supplied without giving rise to problems such as an insufficient amount of gas supplied due to limited capabilities of an evaporator or the like to the LPCVD reaction in the vapor phase by a source which is a liquid or a solid at a room temperature. Likewise, ruthenium ethyl-cyclopentane for use in LPCVD deposition of ruthenium is a liquid source and can be treated in a similar manner to PET. However, since ruthenium cyclopenthane which is a material for ruthenium CVD is a solid, it is heated for evaporation after it is supplied to the buffer 42 in a granular or pellet form. This process is illustrated in FIG. 11B. In this event, the amount of a solid source is managed by weight or the number of pellets. LPCVD performed after the source is evaporated and stored is performed in a similar manner to the counterpart using a monosilane gas.

Third Embodiment

A third embodiment will next be described in connection with an example in which a silicon film on the inner wall of the reaction tube 41 is cleaned or washed-off using a fluorine gas after a polycrystalline silicon film has been deposited using the silicon film LPCVD equipment 40 illustrated in FIG. 8 as described above.

Before the cleaning, details on cleaning and etching to be next processed by the apparatus, such as etching conditions and the like based on a current film thickness on the quartz tube, are input to the equipment controller 49 from an equipment management database 72 (FIG. 8). For example, this is peel-off of 100 nm of a polycrystalline film, which entails LPCVD deposition that is performed at 10 Torr and 300° C. for five minutes with a fluorine gas at a flow rate of 1000 sccm. The total amount of fluorine gas used in the deposition is calculated as follows:

1000 SCCM×5 minutes=5000 SCC

It is assumed that the buffer 42 has an inner volume of 5000 CC. Under the control of the equipment controller 49, as the valve 45 is opened, the buffer 42 is evacuated to a sufficiently low pressure by the vacuum pump 54. Then, the valve 45 is closed and the valve 46.1 is next opened to introduce the fluorine gas into the buffer 42. After the buffer 42 is filled with 5000 SCC of the monosilane gas (a volume of 5000 cm³ under a standard gas state), the valve 46.1 is closed to shut off the buffer 42. Assuming that the fluorine gas is produced by the fluorine gas generator 52 through an electric decomposition reaction of KF.2HF, or a thermal decomposition chemical reaction of KF.6HF, when the fluorine is generated at approximately 100 SCCM/minute, a fluorine gas generator having a scale ten times as large as the current one would be required to provide the fluorine gas at a flow rate of 1000 SCCM which is required by the etching conditions, when the fluorine gas is directly supplied to the LPCVD furnace without using the buffer 42. However, the fluorine gas generator fully operates only for five minutes in which the etching reaction is performed, and is not needed in the rest of the process.

The present invention can support a process which requires a fluorine gas at a flow rate of 1000 SCCM using the fluorine gas generator 52 which is capable of supplying merely 100 SCCM by starting storing the fluorine gas in the buffer 42, 50 minutes before the etching is started. The storage of the fluorine gas in the buffer 42 can be started immediately after a monosilane gas has been removed from the buffer 42 following the end of the previous deposition, so that the fluorine gas can be filled in the buffer 42 in a time period allocated to purge the reaction tube 41, a time period allocated to restore a normal pressure, a time period allocated to remove a semiconductor wafer, and a time period allocated to evacuation and thermal stability for etching. Also, an additional dedicated buffer may be provided other than a buffer for a monosilane gas to fill the buffer with the fluorine gas immediately after the previous etching. Generally, the cleaning and etching is performed at a lower frequency than the deposition, so that the investment, space and the like can be reduced by further reducing the capabilities to supply the fluorine gas.

The processing in the LPCVD equipment 40 in the cleaning process is similar to the deposition process using a monosilane gas. Particularly, in the cleaning process, the end of etching can be often monitored in real time by the end of a rise in temperature in the reaction tube 41 or by an analysis on exhaust gases. This is quite useful because a change over time in the etching rate need not be measured beforehand for controlling the total amount of introduced gas without using the flow rate control illustrated in FIG. 10C.

Figure 12A:
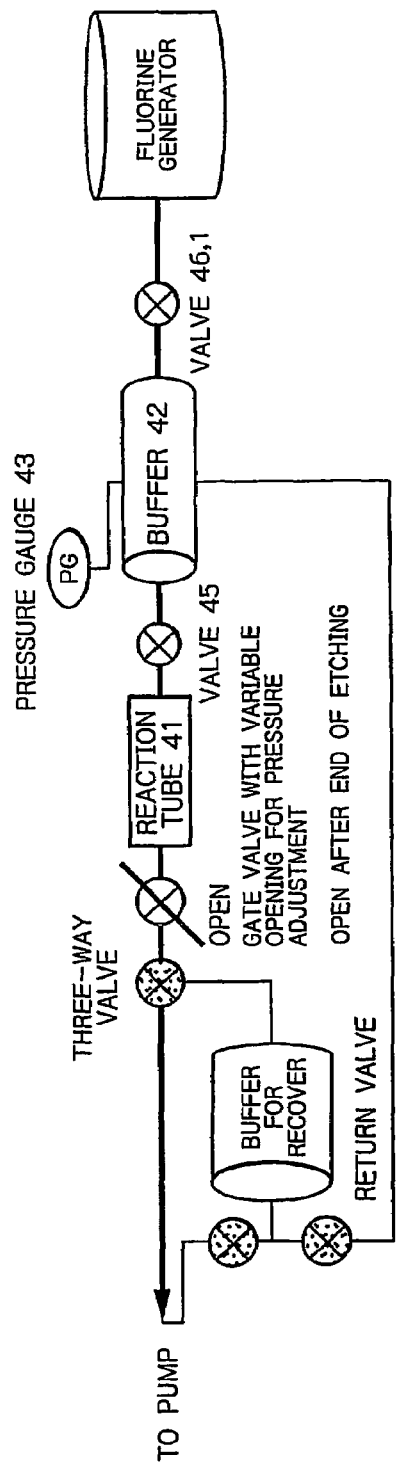
FIGS. 12A and 12B are explanatory diagrams each illustrating an exemplary method of introducing a fluorine gas from the buffer to the reaction tube in the LPCVD equipment illustrated in FIG. 8.

When the reaction tube 41 is isolated for reaction as illustrated in FIG. 10C, an additional buffer may be provided on the exhaust side, as illustrated in FIG. 12A, to return a recovered etching gas again to the buffer 42 for use in the next etching. This can increase a utility efficiency of the material gas, reduce the cost and save energy.

Figure 12B:
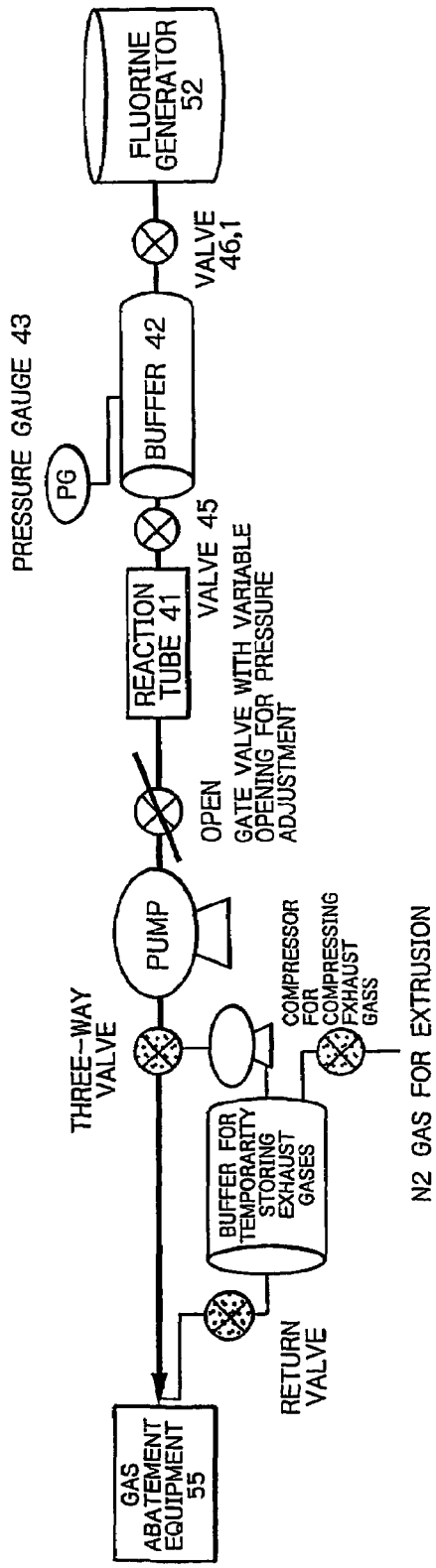

As illustrated in FIG. 12B, not only for materials used in the processing and reaction in the processing facilities, an additional buffer may be provided, for example, before the exhaust gas abatement equipment 55 to adjust the flow rate of exhaust gases which exceed the processing ability of the gas abatement equipment 55. Though the gas abatement equipment 55 effectively operates only when harmful gases are exhausted, a buffer may be provided before the gas abatement equipment 55, permitting a common use of the gas abatement equipment 55 to collectively process exhaust gases from a plurality of processing facilities. Even if exhaust gases simultaneously emitted from a plurality of facilities or a large amount of exhaust gases emitted from a single process exceed the processing rate of the gas abatement equipment 55, the exhaust gases can be temporarily stored in the buffer such that the exhaust gases are sent into the gas abatement equipment 55 from the buffer at a rate below the processing rate of the gas abatement equipment 55, thereby removing surplus gas abatement equipment 55.

Fourth Embodiment

Figure 13:
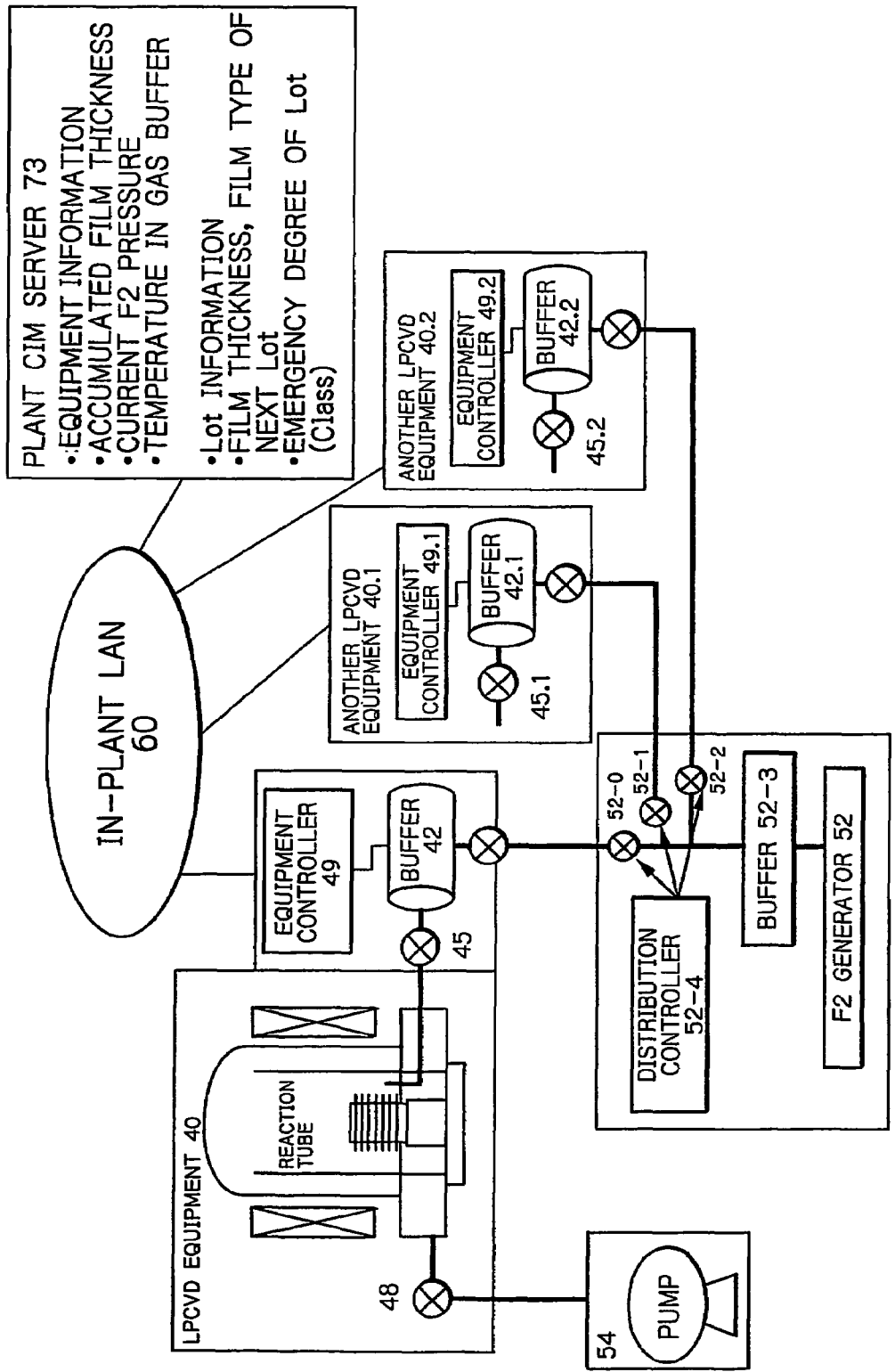
FIG. 13 is a block diagram illustrating another embodiment of a material supply system according to the present invention which employs a plurality of the LPCVD equipment illustrated in FIG. 8.

Referring next to FIG. 13, a fourth embodiment will be described in connection with a system which employs a plurality of silicon film LPCVD equipments 40 illustrated in FIG. 8 to clean the reaction tubes 41 in the plurality of LPCVD equipments.

Similar to the LPCVD equipment 40, LPCVD equipments 40.1, 40.2 are each supplied with a fluorine gas from the fluorine gas generator 52, and controlled by a CIM server 73 in the plant through an in-plant LAN 60 and equipment controllers 49.1, 49.2. A distribution controller 52-4 for controlling branch valves 52-0-52-25 to the fluorine gas generator 52 and respective LPCVD equipments 40, 40.1, 40.3 are also controlled by the CIM server 73.

The CIM server 73 classifies and stores process orders and types of respective lots of unprocessed semiconductor wafers, and priorities of manufacturing for other lots in manufacturing lines as emergency degrees. In this way, the CIM server 73 manages a manufacturing schedule as to when and which lot is processed. The CIM server 73 also calculates a currently accumulated film thickness in the reaction tube in each LPCVD equipment, automatically calculates a film thickness for which cleaning is recommended from data including transitions in a sequence of the film thickness of the deposition and dust, and a sequence of the film thickness and deposition dust after previous cleaning, and the like. The recommended film thickness may be set by a human. The CIM server 73 has a function of scheduling when the reaction tubes are cleaned from current waiting lots and future manufacturing schedule.

In this system, equipments which should be first cleaned (i.e., which use a fluorine gas) are given higher priorities in the scheduling. For example, when the LPCVD equipment 40 should first be cleaned, the valve 45 is opened from the CIM server 73 through the equipment controller 49, and the controllers 49.1, 49.2 of the other LPCVD equipments 40.1, 40.2 close the valves 45.1, 45.2, respectively.

Next, as the CIM server 73 is notified from the equipment controller 49 that a required amount of fluorine gas, calculated from an accumulated film thickness, has been stored in the buffer 42, controlled by any of the methods as illustrated in FIGS. 9A to 9C, the CIM server 73 controls the start of storing the fluorine gas in the buffer 42 in a similar manner in either the LPCVD equipment 40.1 or 40.2 in accordance with the next priority set therein.

When no buffer in any LPCVD equipment 40, 40.1, 40.2 is used after all the storages are completed, the fluorine gas is stored in a buffer 52-3 contained in the fluorine gas generator 52 up to its pressure limit. When there is a further time available, the CIM server 73 stops the operation of the fluorine gas generator 52. Through these operations, the fluorine gas generator 52 can be used in an effective way, resulting in optimization or minimization of resources such as the cost, space, maintenance and the like of the scale.

By controlling the buffer 52-3 in the fluorine gas generator 52 and the branch valves 52-0-52-2 by the distribution controller 52-4, the present system can support any LPCVD equipment irrespective of whether it contains a buffer. In this event, instructions from the CIM server 73 are executed by the distribution controller 52-4 instead of the equipment controller 49 (and/or 49.1, 49.2). Assuming for example that the LPCVD equipment 40 is not provided with the buffer 42 while a fluorine gas is being used, the valve 52-0 is opened in association with the valve 45. In this way, the buffering function can be shared by a plurality of apparatuses.

Fifth Embodiment

Figure 14:
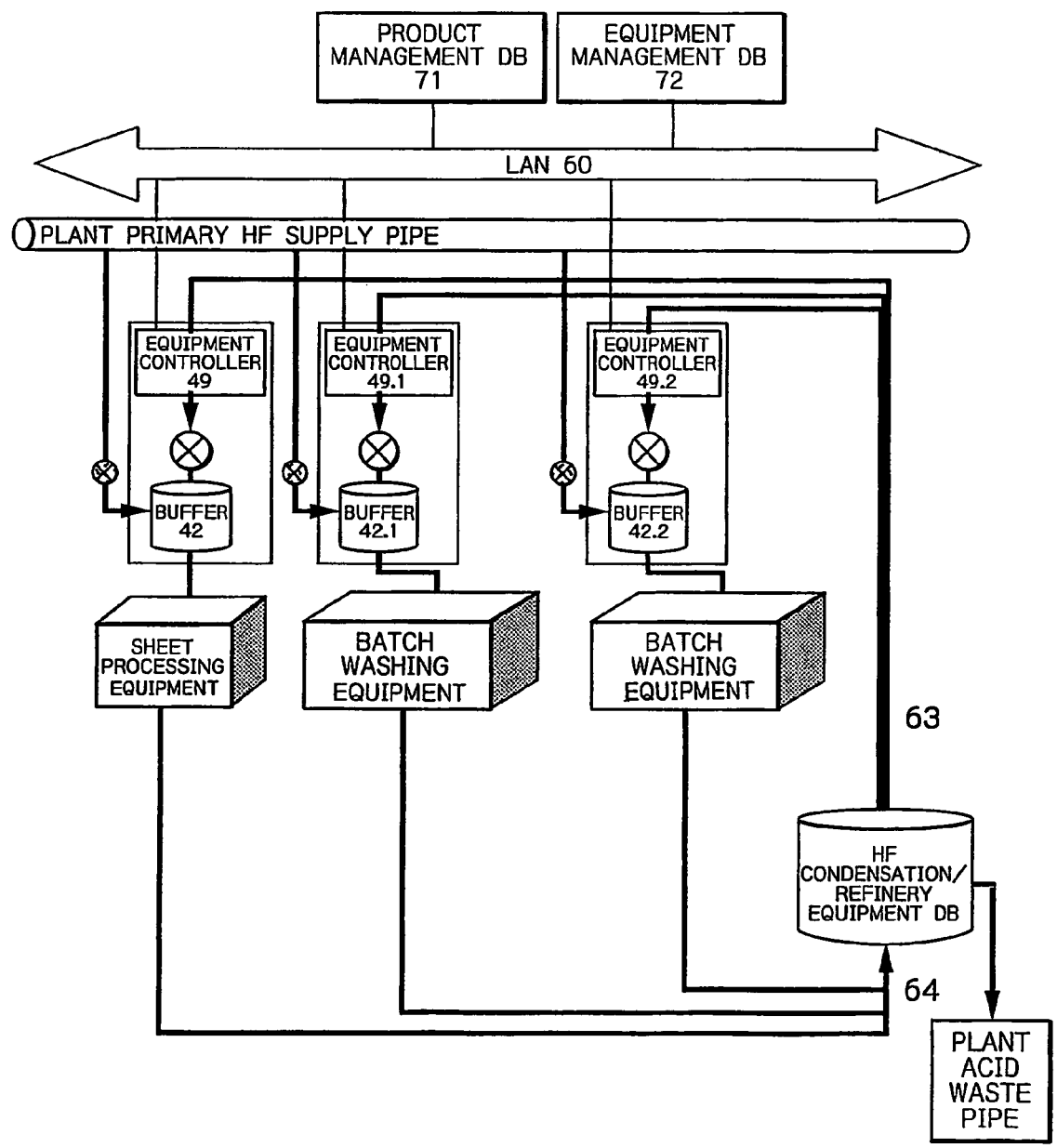
FIG. 14 is a block diagram illustrating a material supply system which reuses a hydrogen fluoride solution in a chemical cleaning process for semiconductor wafers according to another embodiment of the present invention.

Referring next to FIG. 14, a fifth embodiment of the present invention will be described in connection with processing facilities which include a plurality of semiconductor wafer cleaning equipments (three in FIG. 14) and a refiner for condensing and recycling a hydrogen fluoride solution.

In each of the cleaning equipments, a pipe branched from a hydrogen fluoride (HF) supply pipe 62 from the plant, and a return pipe 63 from an HF condensation/refinery equipment 57 are connected to respective buffers 42, 42.1, 42.2 of the cleaning equipments. The pipes connected to the buffers are shut off by respective control valves, and each of the buffers is provided with a sensor (not shown) for measuring the amount of the solution stored in the buffer by level. Equipment controllers 49, 49.1, 49.2 for controlling these buffers, associated sensors, and control valves (import valves) (dedicated controllers may be provided for these components) are associated with the respective cleaning equipments, and controlled by a management DB server for managing the cleaning equipments and LOT through a plant LAN 60. In each of the cleaning equipments, the hydrogen fluoride (HF) solution used in the processing of semiconductor wafers is partially consumed in reactions such as etching of silicon oxide films, and partially not consumed, diluted by pure water or the like, drained, and once transported to the HF condensation/refinery equipment 57 through a discharge pipe 64.

The HF condensation/refinery equipment 57 filters and refines only a hydrogen fluoride component which is returned to the buffers 42, 42.1, 42.2. Distribution to the respective buffers is instructed to buffer controllers (not shown) via the LAN 60 through a calculation of priorities made by the CIM server 73, as is the case with the fourth embodiment, so that the hydrogen fluoride is preferentially distributed to those facilities which next need the hydrogen fluoride in accordance with the instruction. When a semiconductor wafer under processing asks for particularly normal hydrogen fluoride, such hydrogen fluoride is supplied to an associated buffer from a primary hydrogen fluoride source in the plant, and the hydrogen fluoride from the HF condensation/refinery equipment 57 is supplied to the equipment which is given the second highest priority. When the equipment 57 cannot recover hydrogen fluoride at a rate high enough to supply the hydrogen fluoride to requesting equipments at next time, hydrogen fluoride can be compensated from the primary hydrogen fluoride supply source in the plant in a similar manner.

Introduction of a lot can be delayed after the preceding lot has been cleaned by a cleaning equipment in order to fill the hydrogen fluoride buffers with recovered HF in consideration of a cleaning time period in the next manufacturing equipment stored in the lot management DB (not shown). In this way, according to the present system, the CIM server 73 can manage the HF condensation/refinery equipment 57, buffers, and cleaning equipments to provide inexpensive hydrogen fluoride recovered through reuse, using condensation/refinery equipment in a minimum scale without reducing a substantial manufacturing rate.

As described above, the material supply system according to the present invention can eliminate excessive supply capabilities and employ a minimally required scale of material supply facilities, as compared with a prior art example. It is therefore possible to reduce an initial cost and a running cost of the material supply system to reduce a production cost of products produced by a semiconductor device manufacturing plant.

Also, in the material supply system according to the present invention, since a material is temporarily stored in a buffer associated with each processing facility before it is supplied to the processing facility, a required amount of material can be supplied to each processing facility even if a primary material supply source has relatively low supply capabilities.

It is further understood by those skilled in the field that the forgoing description is preferred embodiments of the invention and various changes and modifications may be made in the invention without departing from the spirit and scope thereof.

The invention claimed is:

1. A material supply system for supplying the same kind of a gas, liquid or solid material to a plurality of processing facilities in a semiconductor device manufacturing plant, the system comprising:
   a material supply source;
   a buffer for temporarily storing the material; and
   a controller for controlling the supply of the material from a supply source to the processing facilities, such that a total amount of the material currently used by the plurality of processing facilities does not exceed an amount of the material which can be supplied from the supply source, by controlling a start timing from which the material is supplied to a processing facility,
   wherein the material supply source is a pure water system for producing a plurality of quality grades of pure water, and the controller is adapted to control the supply of pure water to the processing facilities on a grade-by-grade basis.

2. A material supply system according to claim 1, wherein:
   at least-two of the plurality of processing facilities are adapted to send to the controller use request signals for requesting to start using the material, or a use request signal and use end signals for notifying the end or an end notice of use of the material; and
   the controller is adapted to determine, upon receipt of the use request signal associated with the material currently used in at least one processing facility from another processing facility, whether or not a total amount of the material required by these processing facilities exceeds the amount of the material which can be supplied by the supply source, and send a use permission signal to the other processing facility to permit the other processing facility to use the material when determining that the total amount does not exceed.

3. A material supply system for supplying the same kind of a gas, liquid or solid material to a plurality of processing facilities in a semiconductor device manufacturing plant, the system comprising:
   a material supply source;
   a buffer for temporarily storing the material; and
   a controller for controlling the supply of the material from a supply source to a plurality of processing facilities, such that the material is not used simultaneously by a plurality of processing facilities by controlling a start timing from which the material is supplied to a processing facility,
   wherein the material supply source is a pure water system for producing a plurality of quality grades of pure water; and the controller is adapted to control the supply of pure water to the processing facilities on a grade-by-grade basis.

4. A material supply system according to claim 3, wherein:
   at least two of the plurality of processing facilities are adapted to send to the controller use request signals for requesting to start using the material, and use end signals for notifying the end or an end notice of use of the material; and
   the controller is adapted to respond to the use request signal associated with the material currently used in at least one processing facility from another processing facility by delaying sending a use permission signal for permitting the other processing facility which has sent the use request signal to use the material, until the controller receives the use end signal from the processing facility which is using the material.

5. A material supply system for supplying a gas, liquid or solid material to processing facilities in a semiconductor device manufacturing plant, the system comprising:
   a material supply source;
   a buffer for temporarily storing the material; and
   a controller for controlling the supply of the material from the buffer to the processing facilities,
   wherein the material supply source is a pure water system for producing a plurality of quality grades of pure water, and the controller is adapted to control the supply of pure water to the processing facilities on a grade-by-grade basis.

6. A material supply system according to claim 5, further comprising control means for controlling the state of the material in the buffer, and/or measuring means for measuring the state of the material in the buffer.

7. A material supply system according to claim 5 or 6, further comprising means for quantifying the amount of the material required at least in single batch processing by one of the processing facilities.

8. A material supply system according to any one of claims 5 or 6, wherein the buffer is adapted to simultaneously store at least two kinds or more of materials, the system is adapted to supply the materials in the same buffer to the same processing facilities.

9. A material supply system according to any one of claims 5 or 6, wherein materials react in the buffer to produce a new material, and the new material are supplied to the processing facilities from the buffer.

10. A material supply system according to any one of claims 5 or 6, further comprising control means for controlling the temperature, the pressure, and/or the concentration of a material component in the buffer.

11. A material supply system according to any one of claims 5 or 6, wherein an etching gas is stored in a buffer, and further comprises means for supplying the etching gas to wash chambers in the processing facilities.

12. A material supply system according to any one of claims 5 or 6, wherein pure water is stored in the buffer, and further comprises means for supplying the pure water to chambers in the processing facilities.

13. A material supply system according to any one of claims 5 or 6, further comprising means for recovering the material discharged from a chamber of at least one of the processing facilities and to store the recovered material in the buffer.

14. A material supply system according to any one of claims 1 or 6, wherein the system is adapted to supply the material from a single supply source to a plurality of processing facilities.

15. A material supply system according to claim 14, wherein the supply source includes a buffer for temporarily storing the material.

16. A semiconductor device manufacturing plant having a plurality of processing facilities, comprising:

a material supply system according to any one of claims 1, 3 or 5;

database for logging and managing processes in each of the processing facilities; and a CIM-based control system for totally controlling the semiconductor device manufacturing plant, wherein the control system sets a supply rate at which the material supply system supplies the material to the processing facilities, and priorities for supplying the material among the processing facilities based on an operation schedule for the processing facilities, and a semiconductor device manufacturing schedule on the database.

* * * * *